United States Patent [19]

Watabe et al.

[11] Patent Number: 5,051,948

[45] Date of Patent: Sep. 24, 1991

[54] CONTENT ADDRESSABLE MEMORY DEVICE

[75] Inventors: Kiyoto Watabe; Hirofumi Shinohara; Takahisa Eimori; Hideaki Arima; Natsuo Ajika; Yuichi Nakashima; Shinichi Satoh, all of Hyogo, Japan

[73] Assignee: Mitsubishi Denki Kabushiki Kaisha, Tokyo, Japan

[21] Appl. No.: 434,692

[22] PCT Filed: Feb. 22, 1989

[86] PCT No.: PCT/JP89/00179
§ 371 Date: Oct. 20, 1989
§ 102(e) Date: Oct. 20, 1989

[87] PCT Pub. No.: WO89/08314
PCT Pub. Date: Sep. 8, 1989

[30] Foreign Application Priority Data

Feb. 23, 1988 [JP] Japan .................. 63-40009
Feb. 23, 1988 [JP] Japan .................. 63-40011
Feb. 23, 1988 [JP] Japan .................. 63-40012
Jun. 13, 1988 [JP] Japan .................. 63-145176
Feb. 15, 1989 [JP] Japan .................. 1-35428

[51] Int. Cl.[5] ........................................... G11C 15/00
[52] U.S. Cl. ........................... 365/49; 365/185; 365/182
[58] Field of Search ............ 365/49, 154, 190, 185, 365/189.07, 182

[56] References Cited

U.S. PATENT DOCUMENTS 4,408,303 10/1983 Guterman et al. .................. 365/185
4,538,243 8/1985 Zetiner .................................. 365/49
4,831,585 5/1989 Wade et al. .......................... 365/49
4,833,643 5/1989 Hori ...................................... 365/49

FOREIGN PATENT DOCUMENTS 52-20812 6/1977 Japan .
62-165784 7/1987 Japan .
63-31091 2/1988 Japan .

OTHER PUBLICATIONS

Mundy et al., "Low-Cost Associative Memory," *IEEE Journal of Solid-State Circuits*, vol. SC-7, No. 5, Oct. 1972, pp. 364-369.
Grise et al., "Non-Volatile, Static-Access Memory Cell," *IBM Technical Disclosure Bulletin*, vol. 26, No. 1, Jun. 1983, p. 191.

Primary Examiner—Joseph A. Popek
Attorney, Agent, or Firm—Lowe, Price, LeBlanc and Becker

[57] ABSTRACT

In a content addressable memory (CAM) cell according to the present invention, a pair of non-volatile memory transistors hold data, whereby stored data will not disappear even if power is cut. Conducting terminals of these non-volatile transistors are connected to a bit line pair, so that the stored data can be directly read out from the bit line pair. Further, the invention CAM system converts the value of a current flowing in a match line into a voltage value to perform content reference, and hence the same can be employed as an associative memory system.

21 Claims, 34 Drawing Sheets

CONTENT ADDRESSABLE MEMORY DEVICE

TECHNICAL FIELD OF THE INVENTION

The present invention relates to a semiconductor memory device, and more particularly, it relates to improvement in a content addressable memory (CAM) device.

BACKGROUND OF THE INVENTION

FIG. 35 is a circuit diagram showing a CAM cell which is disclosed in IEEE Journal of Solid State Circuits vol. sc-7, No. 5, Oct. 1972, pp. 364-369. A first conducting terminal of a first insulated gate field effect transistor $M_{W1}$ (supposed to be an n-MOS transistor in this case) is connected to a first bit line BL, and its control terminal (gate) is connected to a word line WL. Similarly, a first conducting terminal of a second n-MOS transistor $M_{W2}$ is connected to a second bit line $\overline{BL}$, and its gate is connected to the word line WL.

A first conducting terminal of a third n-MOS transistor $M_{S1}$ is connected to the first bit line BL, and its gate is connected to a second conducting terminal of the first transistor $M_{W1}$. Similarly, a first conducting terminal of a fourth n-MOS transistor $M_{S2}$ is connected to the second bit line $\overline{BL}$, and its gate is connected to a second conducting terminal of the second transistor $M_{W2}$.

A first conducting terminal of a fifth n-MOS transistor $M_D$ is commonly connected to respective second conducting terminals of the third and fourth transistors $M_{S1}$ and $M_{S2}$, while its gate and second conducting terminal are commonly connected to a match line ML.

In the conventional CAM cell structured in the aforementioned manner, the first bit line BL is brought into an "H" level and the second bit line $\overline{BL}$ is brought into an "L" level since the memory cell is formed by the n-MOS transistors. The first transistor $M_{W1}$ is turned on if the word line WL enters an "H" level at this time, and hence positive electric charges are stored in the gate of the third transistor $M_{S1}$ from the first bit line BL which is at the "H" level, whereby the third transistor $M_{S1}$ is also turned on. On the other hand, the second transistor $M_{W2}$ is also turned on in response to the "H" level of the word line WL, while the fourth transistor $M_{S2}$ enters an off state since the gate of the fourth transistor $M_{S2}$ is connected to the second bit line $\overline{BL}$ which is at the "L" level. Writing of information (data) is completed when the word line WL is brought into an "L" level in this state. It is assumed here that this storage state is data logic "1".

In order to retrieve stored data, the match line ML is precharged at an "H" level, and data to be referred to is supplied to the bit line pair BL and $\overline{BL}$. Supposing that "1" is supplied as reference data, the first bit line BL is brought into an "H" level and the second bit line $\overline{BL}$ is brought into an "L" level. At this time, the fifth transistor $M_D$ is turned on since the match line ML is at the "H" level, while the match line ML is connected with the first bit line BL and cut off from the second bit line $\overline{BL}$ since the third and fourth transistors $M_{S1}$ and $M_{S2}$ are in on and off states respectively in the aforementioned storage state "1". However, the "H" level of the match line ML is maintained since the first bit line BL is at the "H" level. Namely, it can be recognized that the stored data matches the reference data since the precharge level "H" of the match line ML is maintained.

When "0" is supplied as the reference data, on the other hand, the first bit line BL is brought into an "L" level and the second bit line $\overline{BL}$ is brought into an "H" level. At this time, charges are extracted from the match line ML being at the "H" level to the first bit line BL being at the "L" level through the fifth transistor $M_D$ and the third transistor $M_{S1}$ which are in on states, whereby the match line ML, which is in a floating state, enters an "L" level. Namely, it can be recognized that the stored data mismatches the reference data since the precharge level "H" of the match line ML is changed to "L".

FIG. 36 is a circuit diagram showing a CAM cell which is disclosed in Japanese Patent Laying-Open Gazette No. 31091/1988. In this CAM cell, a first conducting terminal of a first non-volatile memory transistor $M_{F1}$ (floating gate avalanche transistor, for example) is connected to a word line WL/match line ML, while its control gate is connected to a first bit line BL and its second conducting terminal is grounded. Symmetrically, a first conducting terminal of a second non-volatile memory transistor $M_{F2}$ is connected to the word line WL/match line ML and its control gate is connected to a second bit line $\overline{BL}$, while its second conducting terminal is grounded.

Supposing that the first bit line BL is brought into an "H" level and the second bit line $\overline{BL}$ is brought into an "L" level while the word line WL is brought into an "H" level in the CAM cell shown in FIG. 36, electrons caused by avalanche breakdown in the first floating gate avalanche transistor $M_{F1}$ are attracted toward the control gate which is at an "H" level, whereby the electrons are injected into the floating gate. Consequently, threshold voltage $V_{TH}$ of the first floating avalanche transistor $M_{F1}$ goes high. On the other hand, the control gate of the second floating gate avalanche transistor $M_{F2}$ is at an "L" level, and hence no electron injection into the floating gate is caused and its threshold voltage $V_{TH}$ is maintained in a low state. Thus, information can be written in a pair of non-volatile memory transistors $M_{F1}$ and $M_{F2}$.

In order to refer to such written data, the match line ML is precharged at an "H" level, while the first bit line BL is brought into an "H" level and the second bit line $\overline{BL}$ is brought into an "L" level, for example. At this time, the first non-volatile memory transistor $M_{F1}$ will not conduct since its threshold voltage $V_{TH}$ is high. Further, the second non-volatile memory transistor $M_{F2}$, whose threshold voltage $V_{TH}$ remains in a low state, will not conduct since the potential of its control gate is at an "L" level. That is, both the first and second non-volatile memory transistors are in non-conducting states, so that the "H" level of the match line ML is maintained. Thus, it is recognized that the content reference data supplied to the bit line pair BL and $\overline{BL}$ matches the stored data.

If the first bit line BL is brought into an "L" level and the second bit line $\overline{BL}$ is brought into an "H" level to the contrary, the second non-volatile memory transistor $M_{F2}$ enters a conducting state. Therefore, charges are extracted from the match line ML through the second non-volatile memory transistor $M_{F2}$, and the match line ML is brought into an "L" level. Thus, it is recognized that the content reference data supplied to the bit line pair BL and $\overline{BL}$ mismatches the stored data.

FIG. 37 is a block diagram showing an example of a conventional CAM system. Referring to this figure, a plurality of CAM cells CC are arrayed in the form of a matrix along row and column directions. FIG. 37 illustrates CAM cells CC which are in a four-by-four array. Word lines WL are commonly connected to the CAM cells of the respective rows. First ends of the four word lines WL are connected to a decoder DC. This decoder DC selects one of the word lines WL on the basis of inputted address data A0 and A1. Bit lines BL and $\overline{BL}$ are commonly connected to the CAM cells CC of the respective columns. Respective first ends of the bit lines BL and $\overline{BL}$ are connected to an input/output circuit IO1. Further, match lines ML are commonly connected to the CAM cells CC of the respective rows. Match-/mismatch detection circuits M are provided on terminal ends of the respective match lines ML. These match/mismatch detection circuits M are adapted to detect match/mismatch between reference data on the bit lines BL and $\overline{BL}$ and data stored/held in the CAM cells CC on the respective rows. Further, selectors SL are provided on second ends of the respective word lines WL. These selectors SL are circuits which are adapted to select either the corresponding word lines WL or outputs from the match/mismatch detection circuits M.

On the other hand, RAM cells RC are provided in a four-by-four array, in one-to-one correspondence to the aforementioned CAM cells CC. In the array formed by these RAM cells RC, word lines WL are commonly connected to the RAM cells RC of the respective rows and bit lines BL and $\overline{BL}$ are commonly connected to the RAM cells RC of the respective columns similarly to the aforementioned array of the CAM cells. Outputs of the aforementioned respective selectors SL are supplied to corresponding word lines WL in the array of the RAM cells respectively. First ends of the respective bit lines BL and $\overline{BL}$ are connected to another input/output circuit IO2.

FIG. 38 is a circuit diagram showing the detail of a portion 1R enclosed by dotted lines in FIG. 37. As shown in the figure, one CAM cell includes a transfer transistor TW1 which is connected to a word line WL and a bit line BL, another transfer transistor TW2 which is connected to the word line and another bit line $\overline{BL}$, a memory cell MC which is arranged between these transfer transistors TW1 and TW2 and structured by connecting two inverters in an inverse-parallel manner, and a comparison circuit CON which is formed by four transistors Tr1 to Tr4. All of the transistors employed in FIG. 38 are n-channel MOS transistors.

Operation of the prior art example shown in FIGS. 37 and 38 is now described with reference to a timing chart shown in FIG. 39.

First, operation for writing information in the memory cell MC of the CAM cell CC is described. When the bit line BL is brought into an "H" level and the bit line $\overline{BL}$ is brought into an "H" level while the word line WL is brought into an "H" level and thereafter returned to an "L" level, a node a is maintained at an "H" level and another node b is maintained at an "L" level. This state is called a state in which "1" is written in the memory cell MC. In this state, the transistor Tr1 is off and the transistor Tr2 is on. On the other hand, when the bit line BL is brought into an "L" level and the bit line $\overline{BL}$ is brought into an "H" level while the word line WL is brought into an "H" level and thereafter returned to an "L" level, the node a is maintained at an "L" level and the node b is maintained at an "H" level. This state is called a state in which "0" is written in the memory cell MC. In this state, the transistor Tr1 is on and the transistor Tr2 is off.

Then, operation for referring to storage data in each CAM cell CC is described. In the following description, it is assumed that "1" is stored/held in the memory cell MC of the CAM cell CC which is referred to. First, a control signal $\phi$ of an "H" level is supplied to the gate of a precharge transistor Tp shown in FIG. 38 by a prescribed period, so that the precharge transistor Tp is turned on to precharge the match line ML. Then, information to be referred to is inputted in the bit lines BL and $\overline{BL}$. Supposing that "0" is supplied as this reference information (i.e., supposing that an "L" level is supplied to the bit line BL and an "H" level is supplied to the bit line $\overline{BL}$), the transistor Tr3 is turned off and the transistor Tr4 is turned on. Thus, precharges of the match line ML are extracted through the transistors Tr2 and Tr4 to the ground, which serves as a reference potential source (refer to FIG. 39). Supposing that "1" is supplied to the bit lines BL and $\overline{BL}$ as reference information (i.e., supposing that an "H" level is supplied to the bit line BL and an "L" level is supplied to the bit line $\overline{BL}$), on the other hand, the transistor Tr3 is turned on and the transistor Tr4 is turned off. Supposing that storage data of the memory cells MC of other CAM cells CC in the same row also match the reference data, therefore, the potential at the match line ML is maintained and match information is supplied to a corresponding word line WL on the RAM cell RC side through a driver D. In response to this, previously set storage data are read from the respective RAM cells RC belonging to the corresponding word lines WL and outputted to the exterior through the input/output circuit IO2.

As hereinabove described, the potentials of the memory cells MC are forced to the ground potential when reference data supplied through the bit lines BL and $\overline{BL}$, while the same are maintained at the precharge potential when the former match the latter to the contrary. This operation also applies to the case where "0" is stored/held in the memory cells of the CAM cells CC to be referred to.

In the CAM cell shown in FIG. 35, it is necessary to perform rewriting (refreshment) since charges are stored in the gates of the insulated gate field effect transistors to hold the storage data, while there is such a problem that the storage data are lost when power is cut.

On the other hand, the storage are held even if power is cut in the CAM cell shown in FIG. 36, while the data stored in the memory cell cannot be directly read out from the bit line pair. That is, there is such a problem that the CAM cell shown in FIG. 36 cannot be used as a RAM cell (random access memory cell).

Further, the conventional CAM cell system will not recognize matching unless matching is attained in all bits of the same row since, if a bit of a CAM cell which mismatches reference information is included in a row, the potential of the match line ML is discharged to the ground potential through the said CAM cell. Thus, there is such a problem that it cannot be applied to a system (such as an associative system, for example) which has such a degree of redundancy that it recognizes attainment of matching as a whole if the number of mismatching bits included in the same row is not more than a prescribed number.

DISCLOSURE OF THE INVENTION

In consideration of the aforementioned problems of the prior art, an object of the present invention is to provide a content addressable memory cell which can hold storage data and read out the data directly from a bit line pair even if power is cut, and which has a small power consumption and a high working speed.

Another object of the present invention is to provide a CAM system having a certain degree of redundancy, which can judge that matching is attained as a whole even if mismatching bits are included in the same row, so far as the number of such bits is not more than a prescribed number.

A CAM cell according to one aspect of the present invention includes: a first insulated gate field effect transistor having a first conducting terminal which is connected to a first bit line of a bit line pair, a control terminal which is connected to a word line, and a second conducting terminal; a second insulated gate field effect transistor having a first conducting terminal which is connected to a second bit line of the bit line pair, a control terminal which is connected to the word line, and a second conducting terminal; a first non-volatile memory transistor having a first conducting terminal which is connected to the first bit line, a control terminal which is connected to the second conducting terminal of the second insulated gate field effect transistor, and a second conducting terminal; a second non-volatile memory transistor having a first conducting terminal which is connected to the second bit line, a control terminal which is connected to the second conducting terminal of the first insulated gate field effect transistor, and a second conducting terminal; and a third insulated gate field effect transistor having a first conducting terminal which is commonly connected to the respective second conducting terminals of the first and second non-volatile memory transistors, and a control terminal and a second conducting terminal which are commonly connected to a match line.

In a CAM cell according to another aspect of the present invention, each of first conducting terminals of first and second non-volatile memory transistors is not directly connected to a corresponding one of a pair of bit lines but is connected thereto through one insulated gate field effect transistor, conduction of which is controlled by a word line.

A CAM cell according to still another aspect of the present invention comprises not only a pair of bit lines but a pair of word lines, so that data stored in a pair of non-volatile memory transistors can be read out not only from the bit line pair but from the word line pair.

A CAM cell according to a further aspect of the present invention comprises a non-volatile SRAM (static random access memory) which is formed by two non-volatile memory transistors and four insulated gate field effect transistors, and fifth and sixth insulated gate field effect transistors which are connected in series between a match line and a constant potential such that the fifth insulated gate filed effect transistor has a control terminal which is connected to a first bit line and the sixth insulated gate field effect transistor has a control terminal which is connected to one data node in the non-volatile SRAM cell, and further comprises seventh and eighth insulated gate field effect transistors which are connected in series between the match line and a constant potential such that the seventh insulated gate field effect transistor has a control terminal which is connected to the second bit line and the eighth insulated gate field effect transistor has a control terminal which is connected to another data node in the non-volatile SRAM cell.

A CAM cell according to a further aspect of the present invention comprises an SRAM which is formed by a pair of non-volatile memory transistors and four insulated gate field effect transistors; a fifth insulated gate field effect transistor having a first conducting terminal and a control terminal which are commonly connected to a match line, and a second conducting terminal; a sixth insulated gate field effect transistor having first and second conducting terminals, and a control terminal which is connected to a first data node in an SRAM cell; and a seventh insulated gate field effect transistor having first and second conducting terminals, and a control terminal which is connected to a second data node in the non-volatile SRAM cell, such that the respective first conducting terminals of the sixth and seventh insulated gate field effect transistors are commonly connected to the second conducting terminal of the fifth insulated gate field effect transistor, and the respective second conducting terminals of the sixth and seventh insulated gate field effect transistors are connected to different ones of the pair of bit lines.

A CAM cell according to a further aspect of the present invention comprises a plurality of CAM cells which are arrayed in the form of a matrix along row and column directions, a plurality of word lines which are commonly connected to the CAM cells arrayed in the same rows respectively, a plurality of match lines which are commonly connected to the CAM cells arrayed in the same rows respectively, and a plurality of bit lines which are commonly connected to the said CAM cells arrayed in the same columns respectively, and each CAM cell includes gate means which is connected to corresponding word and bit lines to control transmission of information, a memory cell for storing/holding information supplied through the gate means, and comparison means comparing the information stored in the memory cell with reference information supplied through the corresponding bit line for controlling connection/cutoff between a reference potential source and a corresponding match line on the basis of the result of comparison, while the system further comprises a plurality of match/mismatch detection means each provided for every match line for detecting match/mismatch between information stored in each memory belonging to the corresponding match line and the aforementioned reference information. The aforementioned match-mismatch detection means includes current-voltage conversion means for converting the value of a current flowing in the reference potential source through the match line to a voltage value and voltage sensing means for level-comparing output voltage of the current-voltage conversion means with a prescribed threshold value.

In the CAM cell according to the present invention, non-volatile memory transistors hold storage data, whereby no refresh operation is required, power consumption is small and the working speed is high, while the storage data will not disappear even if power is cut. Further, respective conducting terminals of a pair of non-volatile memory transistors are electrically connected to corresponding ones of a pair of bit lines, whereby stored data can be directly read out from the bit line pair.

In the CAM system according to the present invention, mismatching bits forming the limit of matching decision can be set in a desired number by setting conversion characteristics of current-voltage conversion means and the threshold value of voltage sensing means at appropriate values so that the output of the voltage sensing means is not reversed until a current exceeding a constant value flows to a reference potential source through a match line.

BEST MODES OF CARRYING OUT THE INVENTION

Figure 1:
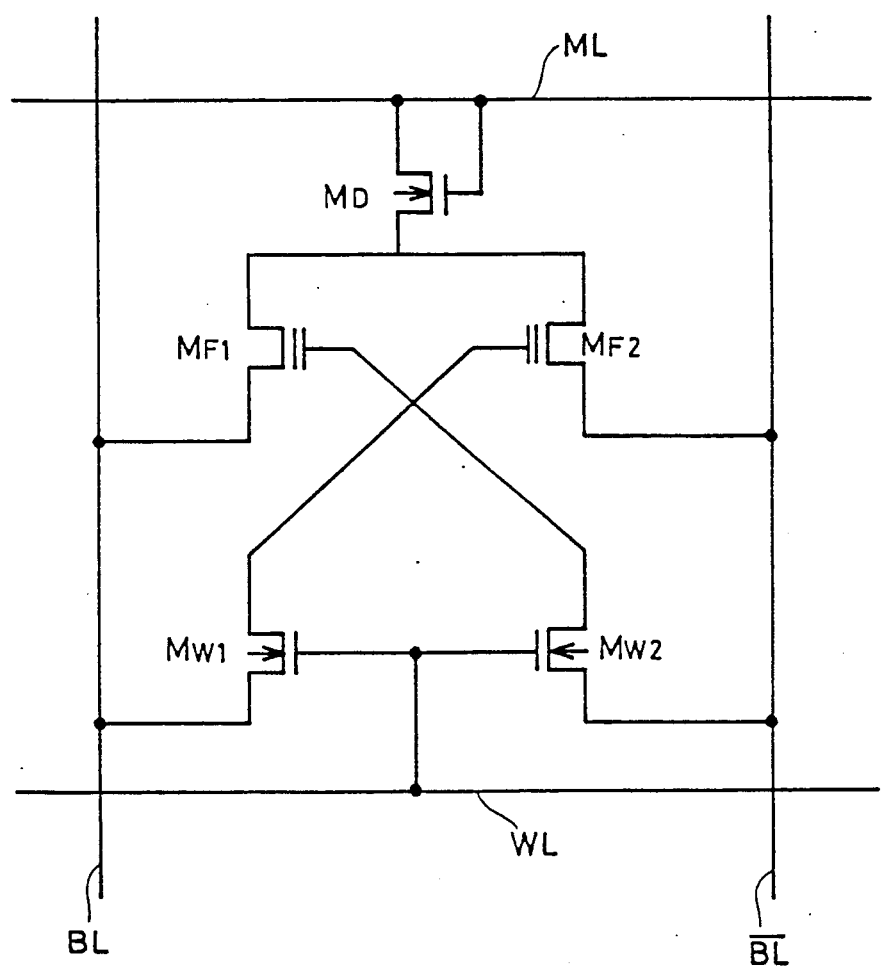
FIG. 1 is a circuit diagram showing a CAM cell according to an embodiment of the present invention.

FIG. 1 is a circuit diagram showing a CAM cell according to an embodiment of the present invention. Referring to this figure, a first conducting terminal of a first insulated gate field effect transistor $M_{W1}$ (supposed to be an n-MOS transistor, in this case) is connected to a first bit line BL, and its gate is connected to a word line WL. Similarly, a first conducting terminal of a second n-MOS transistor $M_{W1}$ is connected to a second bit line $\overline{BL}$, and its gate is connected to the word line WL.

A first conducting terminal of a floating gate avalanche transistor $M_{F1}$, which serves as a first non-volatile memory transistor, is connected to the first bit line BL, and its control gate is connected to a second conducting terminal of the second n-MOS transistor $M_{W2}$. Similarly, a first conducting terminal of a second floating gate avalanche transistor $M_{F2}$ is connected to the second bit line $\overline{BL}$, and its control gate is connected to a second conducting terminal of the first n-MOS transistor $M_{W1}$.

A first conducting terminal of a third n-MOS transistor $M_D$ is commonly connected to respective second conducting terminals of the first and second floating gate avalanche transistors $M_{F1}$ and $M_{F2}$, while its gate and second conducting terminal are commonly connected to a match line ML.

In the CAM cell structured in the aforementioned manner, it is assumed that an "H" level on each signal line is generally 5 V. Only on the match line ML in data writing, however, the "H" level is raised up to 10 V by a driver or the like. It is assumed that an "L" level is 0 V (GND potential) in any case.

It is supposed here that the first bit line BL is brought into an "H" level (5 V) and the second bit line $\overline{BL}$ is brought into an "L" level (0 V) in order to write data "1". If the word line WL is brought into an "H" level (5 V) and the match line ML is brought into an "H" level (10 V) and the match line ML is brought into an "H" level (10 V) at this time, avalanche breakdown takes place between the source and the drain of the floating gate avalanche transistor $M_{F2}$, so that electrons are injected into the floating gate. Thus, the second floating gate avalanche transistor $M_{F2}$ enters an off state since its threshold voltage $V_{TH}$ is increased.

Figure 2:
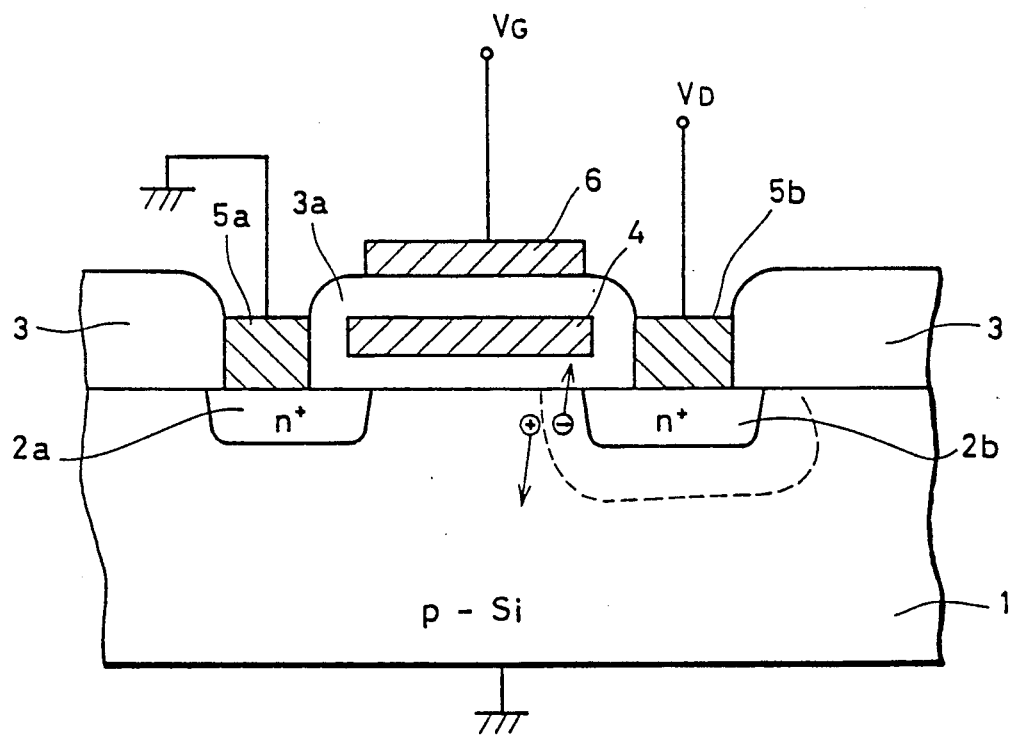
FIGS. 2 to 4 are sectional views schematically showing structures of various non-volatile memory transistors.

Referring to FIG. 2, an example of the second floating gate avalanche transistor $M_{F2}$ is shown in a sectional view, to illustrate the process in which electrons are injected into the floating gate. In this floating gate avalanche transistor, a p-Si substrate 1 is formed on its major surface with $n^+$-type diffusion regions 2a and 2b, which are adapted to define a source and a drain respectively. The source 2a and the drain 2b are connected to a source electrode 5a and a drain electrode 5b, which serve as first and second conducting terminals respectively, through contact holes defined in an insulating layer 3. A floating gate 4 is provided within an insulating layer region 3a on a channel region between the source and the drain, and a control gate 6 is further provided thereon through the insulating layer. The first conducting terminal 5a is connected to a second bit line $\overline{BL}$, which is at an "L" level (0 V), and the second conducting terminal 5b is connected to a match line ML, which is at an "H" level (10 V), through a third n-MOS transistor $M_D$ which is in an on state. That is, the drain potential $V_D = 10$ V, and potential difference between the source and the drain is 10 V. The control gate electrode 6 is connected to an "H" level (5 V) through a first n-MOS transistor $M_{W1}$, which is in an on state. That is, the gate potential $V_G = 5$ V. The p-Si substrate 1 is at the GND potential. At this time, avalanche breakdown is caused between the source and the drain, whereby positive holes escape toward the p-Si substrate 1 and electrons are injected into the floating gate 4 and stored therein as shown by arrows in the figure. Due to an electric field effect caused by the stored electrons, the floating gate avalanche transistor $M_{F2}$ enters an off state since its threshold voltage $V_{TH}$ is increased.

Referring again to FIG. 1, 10 V of the match line ML is applied to the second conducting terminal of the first floating gate avalanche transistor $M_{F1}$ through the third n-MOS transistor $M_D$, while potential difference between the source and the drain is 5 V since 5 V of the first bit line BL is connected to the first conducting terminal. Further, since 0 V of the second bit line $\overline{BL}$ is connected to the control gate through the second n-MOS transistor $M_{W2}$, no avalanche injection of electrons is caused but an on state is maintained in the first floating gate avalanche transistor $M_{F1}$.

Thus, when the word line WL is brought into an "L" level after the first and second floating gate avalanche transistors $M_{F1}$ and $M_{F2}$ are brought into an on state and an off state respectively, it means that data "1" is written in the memory cell. Ultraviolet rays are used to erase the written data.

In order to read out written data, the pair of bit lines BL and $\overline{BL}$ are discharged and thereafter the match line ML is brought into an "H" level while the third n-MOS transistor $M_D$ is brought into an on state. Supposing that data "1" is written in this case, the match line ML being at the "H" level is connected to the first bit line BL through the third n-MOS transistor $M_D$ which is in the on state and the first floating gate avalanche transistor $M_{F1}$, while the same is cut off from the second bit line $\overline{BL}$ by the second floating gate avalanche transistor $M_{F2}$ which is in an off state. Thus, only the potential of the first bit line BL is increased and the data can be read out by sensing potential difference between the pair of bit lines BL and $\overline{BL}$.

In order to retrieve stored data, the match line ML is precharged at an "H" level to supply the bit line pair BL and $\overline{BL}$ with data to be referred to. Supposing that "1" is supplied as the reference data, the first bit line BL is brought into an "H" level and the second bit line $\overline{BL}$ is brought into an "L" level. At this time, the third n-MOS transistor $M_D$ is turned on since the match line ML is precharged, while the match line ML is connected to the first bit line BL and cut off from the second bit line $\overline{BL}$ since the first and second floating gate avalanche transistors $M_{F1}$ and $M_{F2}$ are in an on state and an off state respectively if the stored data is "1". However, the "H" level of the match line ML is maintained as it is since the first bit line BL is at the "H" level. That is, it can be recognized that the stored data matches the reference data since the precharge level "H" of the match line ML is maintained.

If reference data "0" is supplied when data "1" is stored, the first bit line BL is brought into an "L" level and the second bit line $\overline{BL}$ is brought into an "H" level, whereby charges are extracted from the match line ML being at an "H" level to the first bit line BL through the third n-MOS transistor $M_D$ and the first floating gate avalanche transistor $M_{F1}$, and the match line ML enters an "L" level. It can be recognized that the stored dat mismatches the reference data since the "H" level of the match line ML is changed to the "L" level.

When both lines of a certain bit line pair BL and $\overline{BL}$ are brought into "H" levels in a CAM cell array including a plurality of such CAM cells, an "H" level of the match line ML is maintained regardless of stored data, whereby only data of other memory bits can be retrieved by leaving this memory bit in a don't care state, i.e., disregarding the same.

While the above embodiment has been described with reference to floating gate avalanche transistors holding storage data, MNOS (metal nitride oxide silicon) transistors can be equivalently employed in place of the floating gate avalanche transistors.

Figure 3:
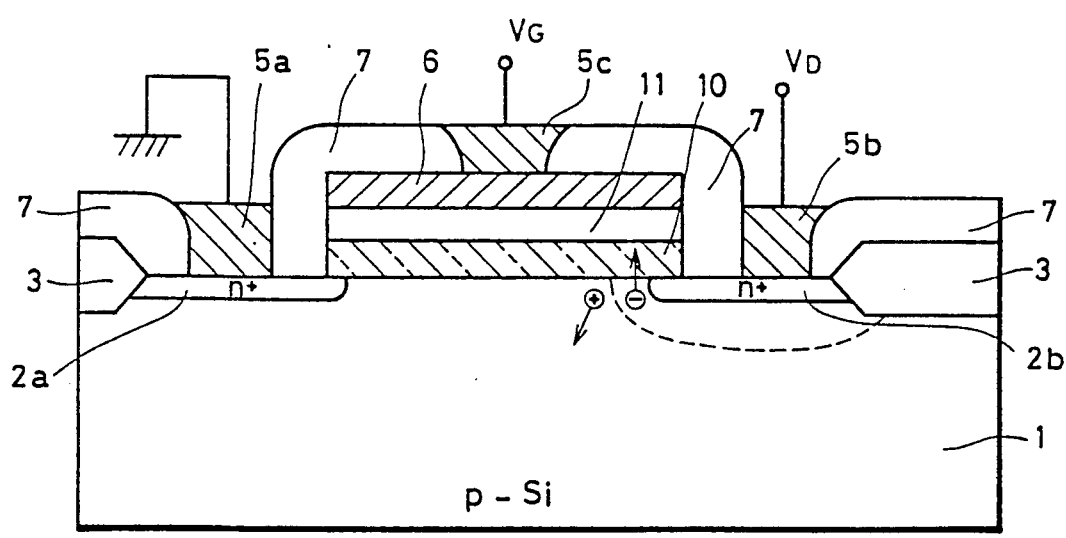

FIG. 3 is a sectional view showing an exemplary MNOS transistor. The MNOS transistor shown in FIG. 3 is similar to the floating gate avalanche transistor shown in FIG. 2, while an oxide film 10, a nitride film 11 and a control gate 6 are successively stacked on a channel region. These layers 10, 11 and 6 are covered with an insulating film 7, and the control gate 6 is connected to a gate electrode 5c through a contact hole which is defined in the insulating film 7. Electrons can be stored in the vicinity of the interface between the oxide film 10 and the nitride film 11, whereby this MNOS transistor can be driven similarly to the floating gate avalanche transistor.

In the embodiment shown in FIG. 1, FLOTOX (floating gate tunnel oxide) transistors can also be employed as the non-volatile memory transistors $M_{F1}$ and $M_{F2}$. In this case, all "H" levels may be made 10 V, for example, in data writing, and all "H" levels may be made 5 V, for example, in data reading and retrieval. Further, data written in such FLOTOX transistors can be electrically erased.

Figure 4:
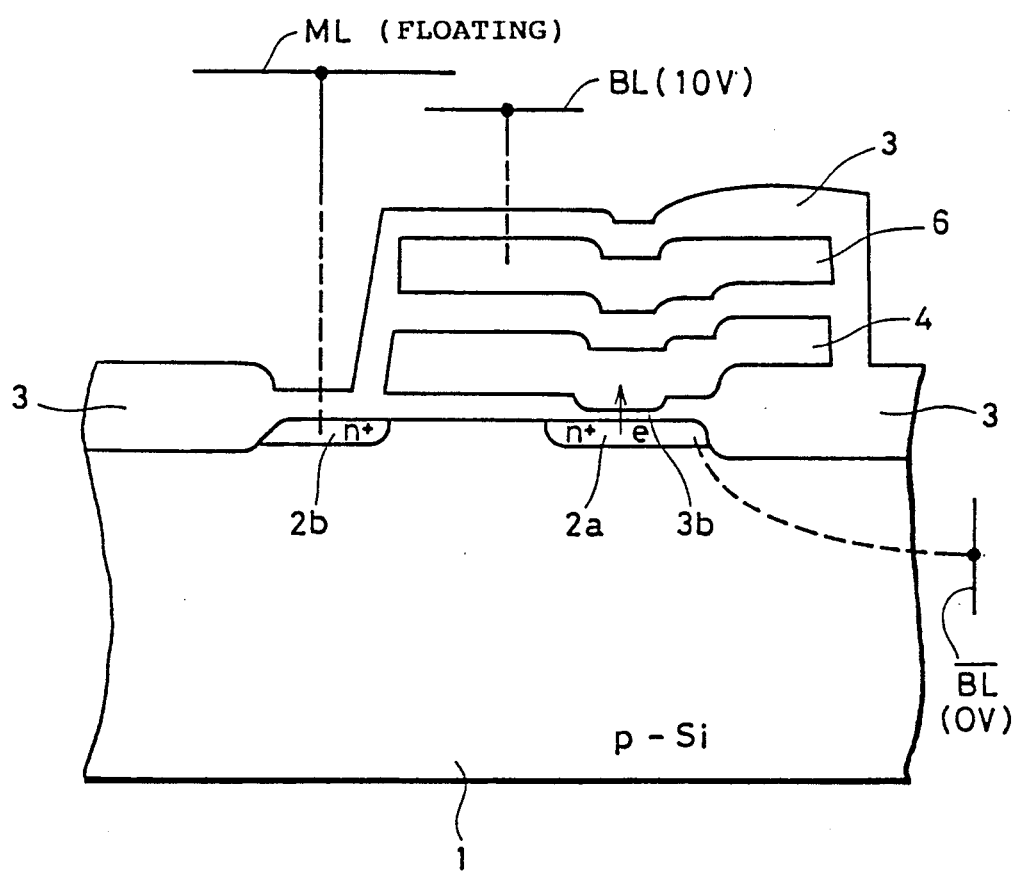

Referring to FIG. 4, an exemplary FLOTOX transistor is shown in section, to illustrate the process in which electrons are injected into a floating gate. In this FLOTOX transistor, a p-Si substrate 1 is provided on its major surface with two n+-type diffusion regions 2a and 2b respectively serving as first and second conducting terminals, which are covered with an insulating layer 3. A floating gate 4 is provided through the insulating layer above a channel region between the two n+-type diffusion regions 2a and 2b and the n+-type diffusion region 2a, and a control gate 6 is provided further thereon through the insulating layer. When 10 V of a first bit line BL is applied to the control gate 6 in such a state that a match line ML connected to the second conducting terminal 2b is in a floating state and 0 V of a second bit line $\overline{BL}$ is connected to the first conducting terminal 2a, electrons are tunneled from the n+-type diffusion region 2a into the floating gate 4 and stored therein as shown by an arrow e, through an extremely thinned insulating layer region 3b. Due to an electric field effect caused by the stored electrons, this FLOTOX transistor enters an off state since its threshold voltage $V_{TH}$ is increased.

Figure 5:
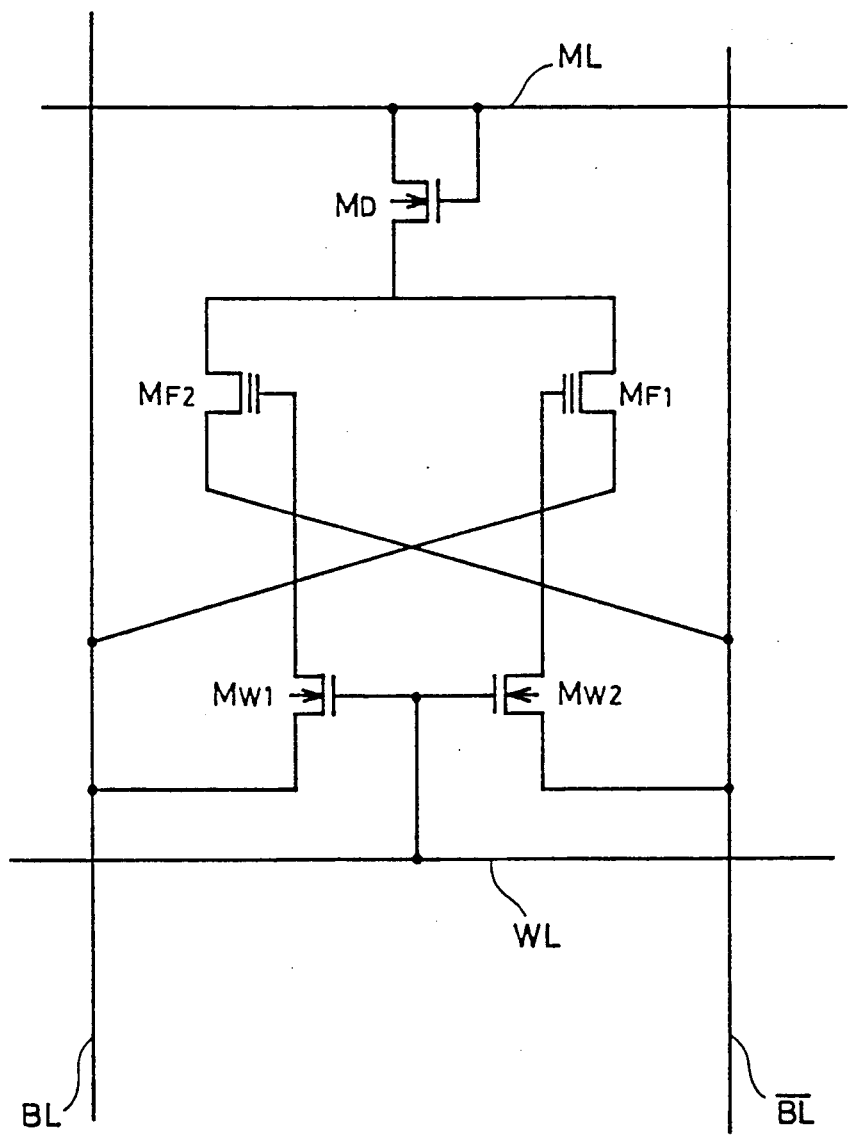
FIGS. 5 to 14 are circuit diagrams showing CAM cells according to further various embodiments of the present invention.
Figure 6:
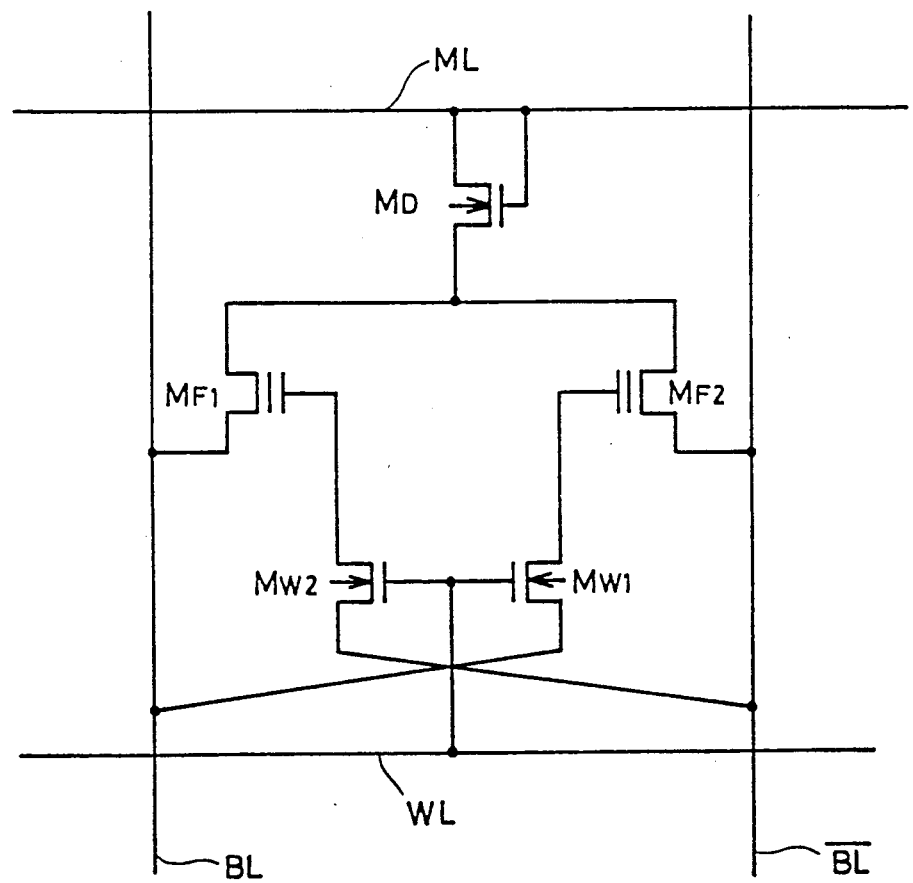

FIGS. 5 and 6 are circuit diagrams showing other two embodiments of the present invention. CAM cells according to these embodiments have circuits which are absolutely equivalent to the CAM cell shown in FIG. 1. When these CAM cells are implemented as semiconductor devices, however, interconnections crossing each other are varied with the embodiments. Since the size of the chip area is influenced by which interconnections cross each other in the layout of an integrated circuit, appropriate one of the above embodiments may be selected according to circumstances.

Figure 7:
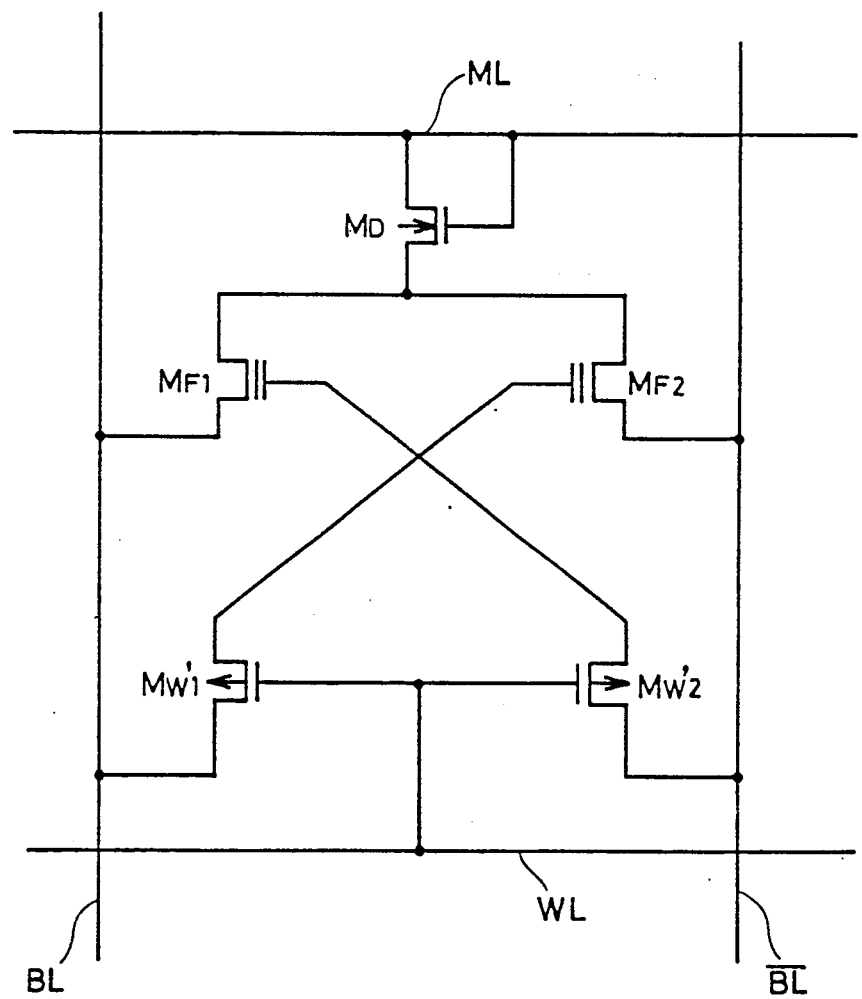

FIG. 7 is a circuit diagram showing a further embodiment of the present invention. In this CAM cell, the first and second n-MOS transistors $M_{W1}$ and $M_{W2}$ in the CAM cell of FIG. 1 are replaced by first and second p-MOS transistors $M_{W1}'$ and $M_{W2}'$ respectively. Therefore, it operates similarly to the first CAM cell by bringing a word line into an "L" level (0 V) in data writing and bringing the same into an "H" level (5 V) in reading and retrieval.

Figure 8:
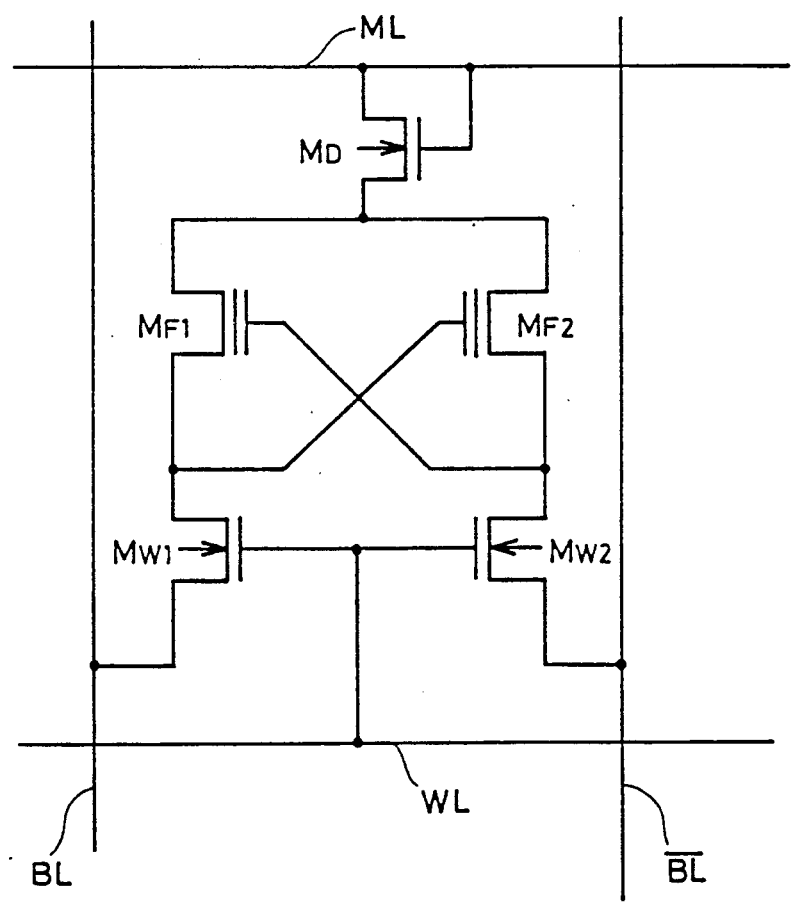

FIG. 8 is a circuit diagram showing a further embodiment of the present invention. While this CAM cell is similar to the CAM cell shown in FIG. 1, a first conducting terminal of a first non-volatile memory transistor $M_{F1}$ is not directly connected to a first bit line BL but is connected thereto through a first n-MOS transistor $M_{W1}$. Similarly, a first conducting terminal of a second non-volatile memory transistor $M_{F2}$ is not directly connected thereto through a second n-MOS transistor $M_{W2}$. It may be clear that the CAM cell of FIG. 8 operates equivalently to the CAM cell shown in FIG. 1 by bringing a word line WL into an "H" level not only in writing but in reading and content reference.

Figure 9:
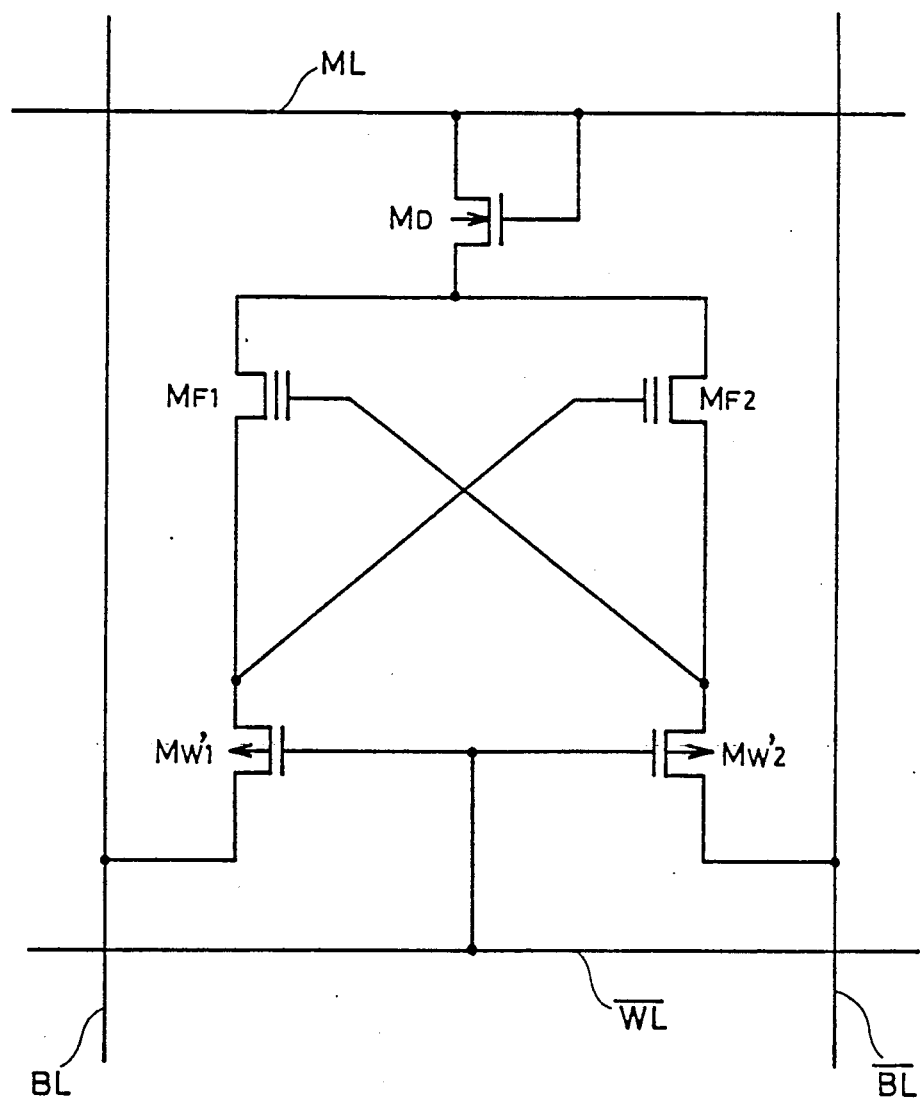

FIG. 9 is a circuit diagram showing a further embodiment of the present invention. While the CAM cell of FIG. 9 is similar to the CAM cell shown in FIG. 7, a first conducting terminal of a first non-volatile memory transistor $M_{F1}$ is connected to a first bit line BL through a p-channel type first MOS transistor $M_{W1}'$, and a first conducting terminal of a second non-volatile memory transistor $M_{F2}$ is connected to a second bit line $\overline{BL}$ through a p-channel type second MOS transistor $M_{W2}'$. It may be clear that the CAM cell of FIG. 9 operates similarly to the CAM cell shown in FIG. 7 by bringing a word line $\overline{WL}$ into an "L" level.

Figure 10:
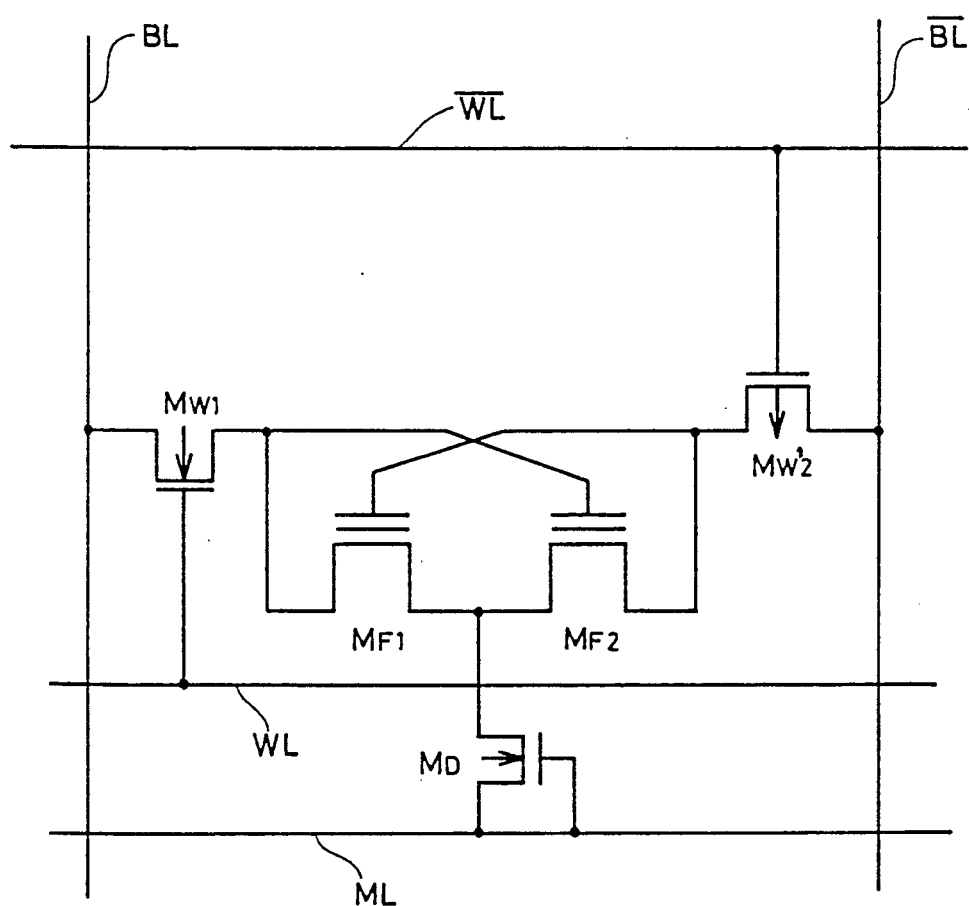

FIG. 10 is a circuit diagram showing a further embodiment of the present invention. In this CAM cell, the second n-MOS transistor $M_{W2}$ in the CAM cell shown in FIG. 8 is replaced by a p-MOS transistor $M_{W2}'$, and hence it comprises a second word line $\overline{WL}$ to which a gate of the p-MOS transistor $M_{W2}'$ is connected. It may be clear that the CAM cell of FIG. 10 also operates similarly to the CAM cell shown in FIG. 8 by bringing the second word line $\overline{WL}$ into an "L" level.

Figure 11:
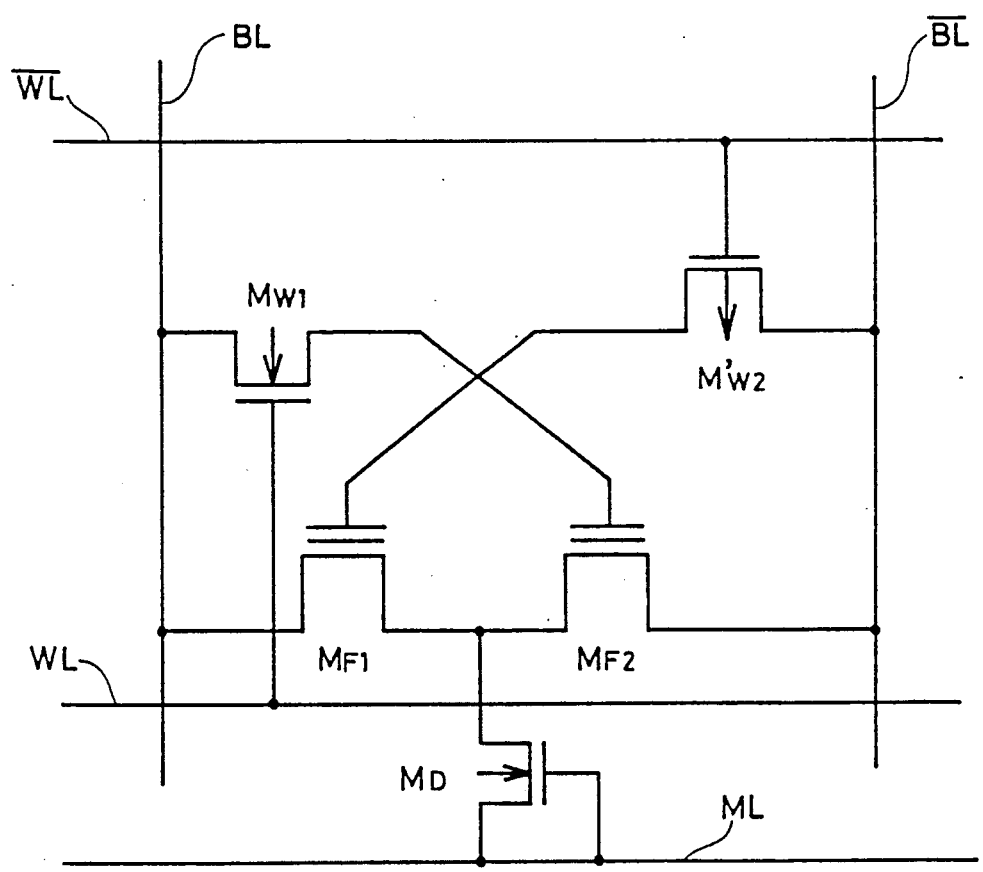

FIG. 11 is a circuit diagram showing a further embodiment of the present invention. While the CAM cell of FIG. 11 is similar to the CAM cell shown in FIG. 10, a first conducting terminal of a first non-volatile memory transistor $M_{F1}$ is directly connected to a first bit line BL and a first conducting terminal of a second non-volatile memory transistor $M_{F2}$ is also directly connected to a second bit line $\overline{BL}$.

Figure 12:
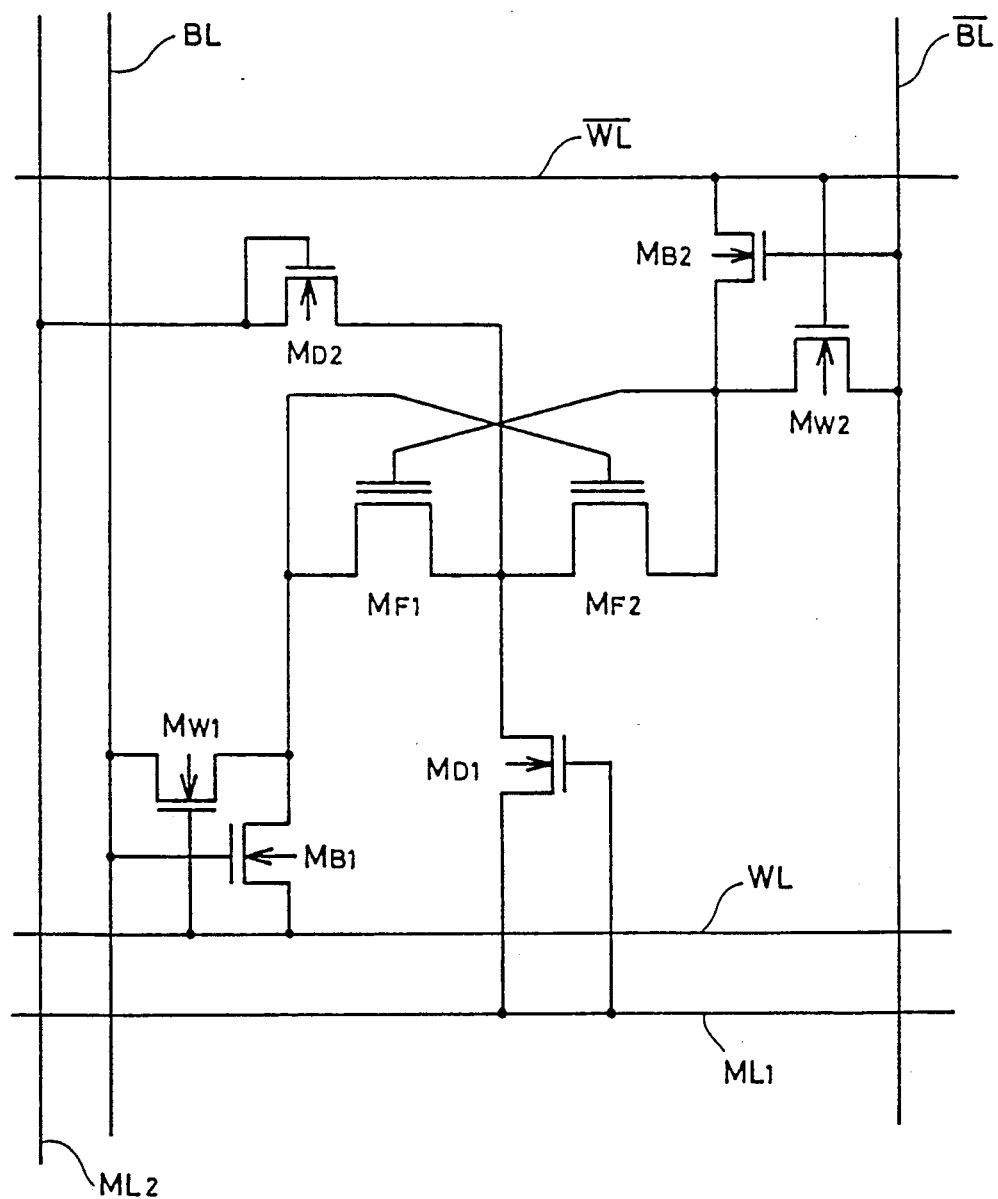

FIG. 12 is a circuit diagram showing a further embodiment of the present invention. While the CAM cell of FIG. 12 is similar to the CAM cell shown in FIG. 8, a gate terminal of a second n-MOS transistor $M_{W2}$ is connected to a second word line $\overline{WL}$. Further, the CAM cell shown in FIG. 12 includes a fourth n-MOS transistor $M_{B1}$ having a first conducting terminal which is connected to a first word line WL, a control terminal which is connected to a first bit line BL, and a second conducting terminal which is connected to a first conducting terminal of a first non-volatile memory transistor $M_{F1}$, and further includes a fifth n-MOS transistor $M_{B2}$ having a first conducting terminal which is connected to the second word line $\overline{WL}$, a control terminal which is connected to a second bit line $\overline{BL}$, and a second conducting terminal which is connected to a first conducting terminal of a second non-volatile memory transistor $M_{F2}$. In addition, the CAM cell shown in FIG. 12 includes a sixth n-MOS transistor $M_{D2}$ having a first conducting terminal which is commonly connected to the second conducting terminals of the first and second non-volatile memory transistors $M_{F1}$ and $M_{F2}$, and a gate terminal and a second conducting terminal which are commonly connected to a second match line ML2.

In the CAM cell of FIG. 12 having such structure, it may be understood that data can be written from the bit line pair BL and $\overline{BL}$ in the first and second non-volatile memory transistors $M_{F1}$ and $M_{F2}$ and read out from the same similarly to the CAM cell shown in FIG. 8, by supplying the second word line $\overline{WL}$ with the same signal as that for the first word line WL. It may be also understood that, when content reference data is supplied to the bit line pair BL and $\overline{BL}$, judgement can be made as to whether or not stored data matches the reference data depending on whether or not a precharged potential of a first match line ML1 is changed.

In the CAM cell shown in FIG. 12, it may further be understood that the bit line pair BL and $\overline{BL}$ and the word line pair WL and $\overline{WL}$ are in symmetrical relation to each other and data can be also written from the word line pair WL and $\overline{WL}$ in the first and second non-volatile memory transistors $M_{F1}$ and $M_{F2}$ and read out from the same. It may be also understood that, when content reference data is supplied to the word line pair WL and $\overline{WL}$, it can be recognized whether or not stored data matches the reference data depending on whether or not a precharged potential of the second match line ML2 is changed.

Figure 13:
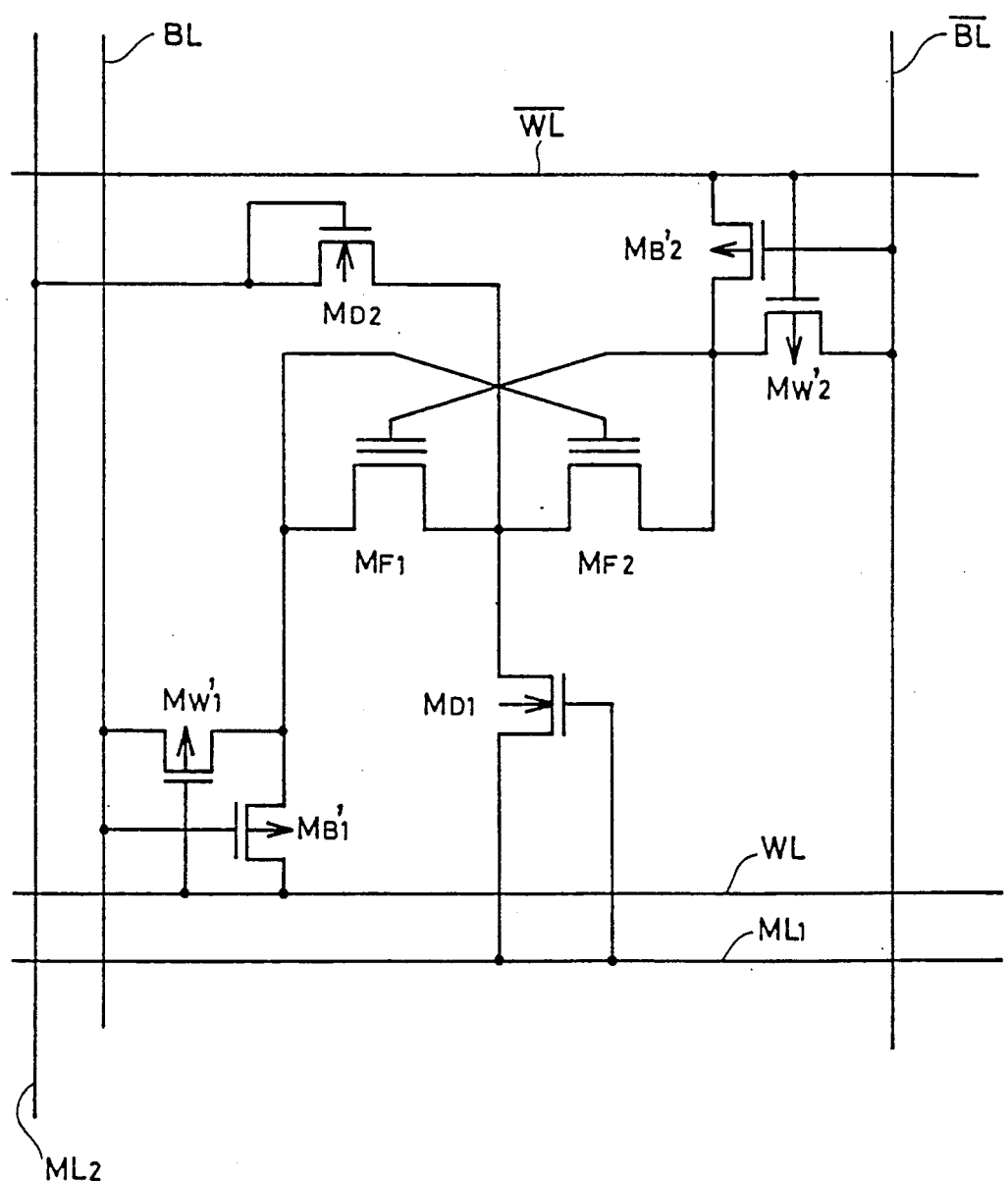

FIG. 13 is a circuit diagram showing a further embodiment of the present invention. While the CAM cell of FIG. 13 is similar to the CAM cell shown in FIG. 12, the first and second n-MOS transistors $M_{W1}$ and $M_{W2}$ and the fourth and fifth n-MOS transistors $M_{B1}$ and $M_{B2}$ are replaced by p-MOS transistors $M_{W1}'$, $M_{W2}'$, $M_{B1}'$ and $M_{B2}'$ respectively. It may be understood that operation similar to that of the CAM cell shown in FIG. 12 can be performed in the CAM cell of FIG. 13 by supplying an appropriate signal potential to a pair of word lines WL and $\overline{WL}$ or a pair of bit lines BL and $\overline{BL}$.

Figure 14:
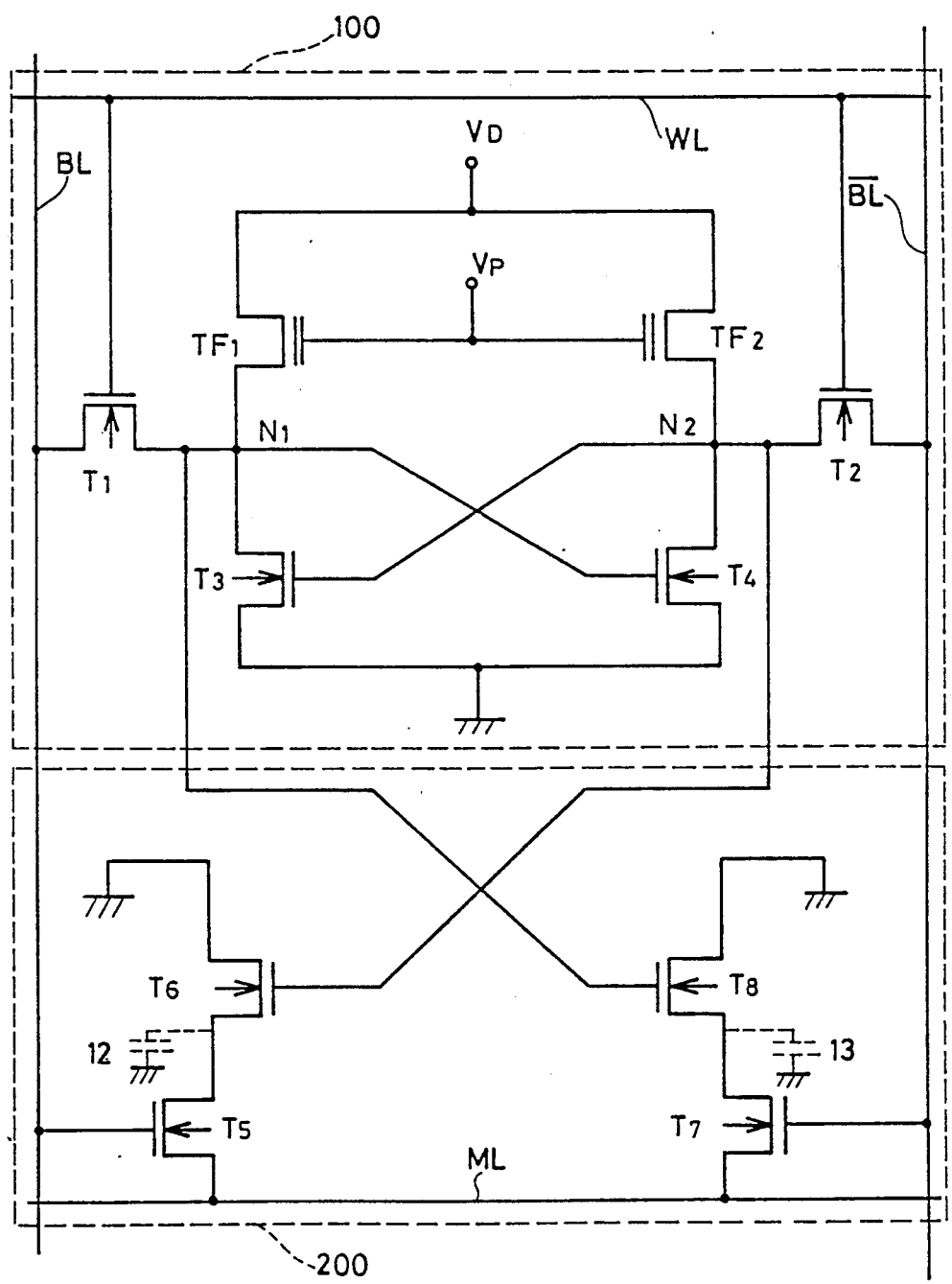

FIG. 14 is a circuit diagram showing a further embodiment of the present invention. This CAM cell includes a non-volatile SRAM cell 100, which is shown in IBM Technical Disclosure Bulletin, Vol. 26, No. 1, June 1983, pp. 191-192. In this non-volatile SRAM cell 100, a first conducting terminal of a first n-MOS transistor T1 is connected to a first bit line BL, while its gate is connected to a word line WL and its second conducting terminal is connected to a first data node N1. A first conducting terminal of a first non-volatile memory transistor TF1 is connected to the first data node N1 and its control gate is connected to a programming line Vp, while its second conducting terminal is connected to a power supply line $V_D$. Similarly, a first conducting terminal of a second n-MOS transistor T2 is connected to a second bit line $\overline{BL}$, while its gate is connected to the word line WL and its second conducting terminal is connected to a second data node N2. A first conducting terminal of a second non-volatile memory transistor TF2 is connected to the second data node N2 and its control gate is connected to the programming line Vp, while its second conducting terminal is connected to the power supply line $V_D$. Further, a first conducting terminal of a third n-MOS transistor T3 is connected to the first data node N1 and its gate is connected to the second data node N2, while its second conducting terminal is connected to an earthing wire. In addition, a first conducting terminal of a fourth n-MOS transistor T4 is connected to the second data node N2 and its gate is connected to the first data node N1, while its first conducting terminal is connected to the earthing wire.

Figure 15:
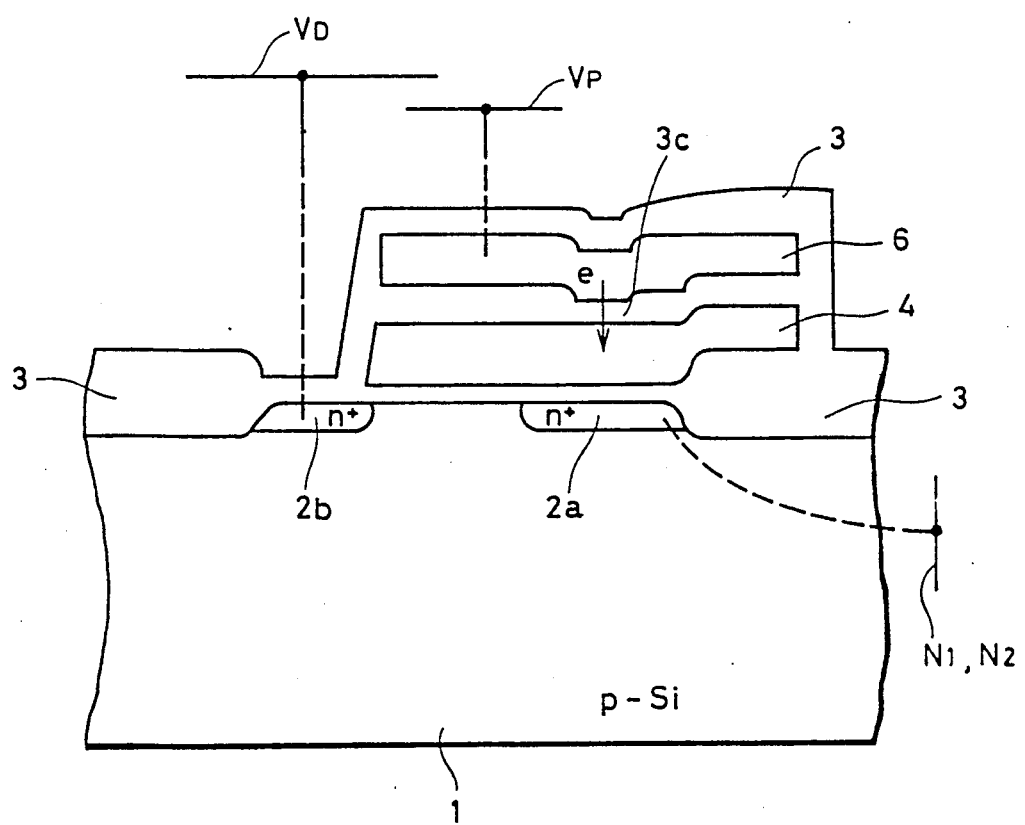
FIG. 15 is a sectional view schematically showing the structure of still another non-volatile semiconductor memory cell.

FIG. 15 is a sectional view schematically showing a FLOTOX transistor which can be employed as the non-volatile memory transistor TF1 or TF2 in the SRAM cell 100. The FLOTOX transistor of FIG. 15, which is similar to that shown in FIG. 4, has no thinned insulating layer region 3b between a floating gate 4 and a substrate 1 but has a thinned insulating region 3b between the floating gate 4 and a control gate 6.

In ordinary write or read operation in the non-volatile SRAM cell 100, the FLOTOX transistors TF1 and TF2 serve as ordinary depression loads, since their floating gates are not charged. The control gates of these load transistors TF1 and TF2 are at the ground potential (0 V). However, when power cutoff is imminent, the supply voltage $V_D$, which is ordinarily at 5 V, rises to the programming potential of about 15 V. Supposing that the first data node N1 is at an "H" level (5 V) and the second data node N2 is at an "L" level (0 V), electrons are injected from the programming gate 6 of the first FLOTOX transistor TF1 into the floating gate 4, and this floating gate 4 is charged negative. On the other hand, the second data node N2 is at the ground potential, and hence no electrons are injected into the floating gate of the second FLOTOX transistor TF2, but the same is in an ordinary neutral state. Thus, the data are held in the floating gates of the first and second FLTOX transistors T1 and T2 in a non-volatile manner.

When power is reset, first the word line WL is brought into an "H" level and the pair of bit lines BL and $\overline{BL}$ are brought into "L" levels, whereby the first and second data nodes N1 and N2 are brought into "L" levels. Then, both the power supply line $V_D$ and the programming line Vp are raised up to 15 V. The first FLTOX transistor TF1 tends to enter a non-conducting state since its floating gate is charged negative. On the other hand, the second FLTOX transistor TF2 tends to enter a conducting state since its floating gate is in a neutral state. Therefore, the first data node N1 remains at the ground potential, while the second data node N2 is charged toward the programming potential. Thus, data reverse to those stored in the first and second data node N1 and N2 before power cutoff are stored. Then the supply voltage $V_D$ is returned to 5 V and electrons are extracted from the floating gate 4 of the first FLOTOX transistor T1 to the programming gate 6, so that the floating gate is returned to the neutral state. Thereafter the programming line Vp is returned to the ground potential. Thus, the non-volatile SRAM cell 100 is enabled for ordinary read/write operation. The inverted data stored in the first and second data nodes N1 and N2 after power reset can be easily returned to the original data by reading out the same once and rewriting the same through an inverter.

The CAM cell shown in FIG. 14 further includes a content addressable circuit 200 which is formed by four n-MOS transistors T5 to T8, in addition to the non-volatile SROM cell 100. A first conducting terminal of the fifth n-MOS transistor T5 is connected to the match line ML, and its gate is connected to the first bit line BL. A first conducting terminal of the sixth n-MOS transistor T6 is connected to a second conducting terminal of the fifth n-MOS transistor T5 and its gate is connected to the second data node N2, while its second conducting terminal is connected to an earthing wire. Symmetrically, a first conducting terminal of the seventh n-MOS transistor T7 is connected to the match line ML and its gate is connected to the second bit line $\overline{BL}$. A first conducting terminal of the eighth n-MOS transistor T8 is connected to a second conducting terminal of the seventh n-MOS transistor T7 and its gate is connected to the first data node N1, while its second conducting terminal is connected to the earthing wire.

In order to perform retrieval operation in the CAM cell structured in the aforementioned manner, the pair of bit lines BL and $\overline{BL}$ are first predischarged at "L" levels and the fifth and seventh n-MOS transistors T5 and T7 are brought into non-conducting states, and thereafter the match line ML is precharged. It is supposed that data stored in the SRAM cell 100 is "1".

That is, supposing that the first data node N1 is at an "H" level and the second data node N2 is at an "L" level, the sixth n-MOS transistor T6 is in a non-conducting state and the eighth n-MOS transistor T8 is in a conducting state. Therefore, when reference data of "1" (i.e., "H" level BL and "L" level $\overline{BL}$) is supplied to the pair of bit lines and $\overline{BL}$, the fifth n-MOS transistor T5 enters a conducting state and the seventh n-MOS transistor T7 enters a non-conducting state. That is, the potential of the precharged match line ML is maintained since the sixth n-MOS transistor T6 and the seventh n-MOS transistor T7 are in non-conducting states. Thus, it is recognized that the reference data supplied to the bit line pair BL and $\overline{BL}$ matches the data stored in the SRAM cell 100.

When reference data of "0" (i.e., "L" level BL and "H" level $\overline{BL}$) is supplied to the pair of bit lines BL and $\overline{BL}$ to the contrary, the fifth n-MOS transistor T5 enters a non-conducting state and the seventh n-MOS transistor T7 enters a conducting state. That is, both of the seventh and eighth n-MOS transistors T7 and T8 enter conducting states, whereby charges are extracted from the match line ML to the earthing wire and the match line ML goes to the ground potential. Thus, it is recognized that the reference data supplied to the bit line pair BL and $\overline{BL}$ mismatches the data stored in the SRAM cell 100.

When content reference data is supplied to the bit line pair BL and $\overline{BL}$ in the CAM cell shown in FIG. 14, either the fifth or seventh n-MOS transistor T5 or T7 is necessarily in a conducting state. Also when the reference data matches the stored data, therefore, charges of the precharged match line ML partially flow into either parasitic capacitance 12 formed between the fifth and sixth n-MOS transistors T5 and T6 or parasitic capacitance 13 formed between the seventh and eighth n-MOS transistors T7 and T8. Thus, the potential at the match line ML is reduced and hence an error of content reference may be caused.

Figure 16:
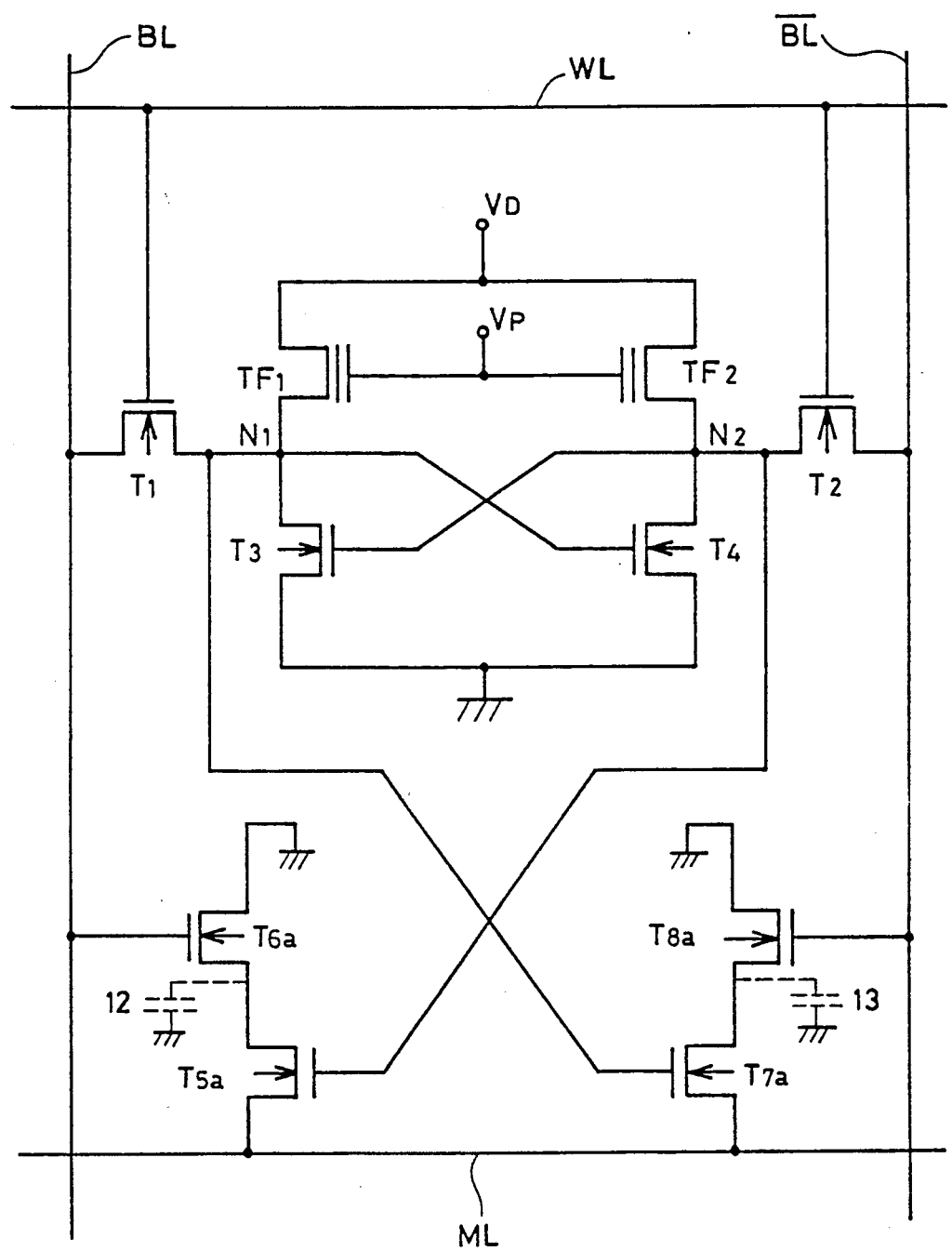
FIGS. 16 to 27 are circuit diagrams showing CAM cells according to further various embodiments of the present invention.

FIG. 16 is a circuit diagram showing a further embodiment of the present invention. In the CAM cell of FIG. 16, which is similar to the CAM cell shown in FIG. 14, a gate of a fifth n-MOS transistor T15a is connected to a second data node N2, and a gate of a sixth n-MOS transistor T6 is connected to a first bit line BL. Symmetrically, a gate of a seventh n-MOS transistor T7a is connected to the first data node N1, and a gate of an eighth n-MOS transistor T8a is connected to a second bit line $\overline{BL}$. When data "1" is stored in the CAM cell of FIG. 16 (i.e., "H" level data node N1 and "L" level data node N2), the seventh n-MOS transistor T7a is in a conducting state, and hence parasitic capacitance 13 is precharged simultaneously when a match line ML is precharged. Therefore, no charges further flow from the match line ML into the parasitic capacitance 13 when the reference data supplied to the bit line pair BL and $\overline{BL}$ matches the data stored in the SRAM cell 100. In other words, no partial reduction is caused in the potential of the match line ML upon data matching, and malfunction of content reference is prevented.

Figure 17:
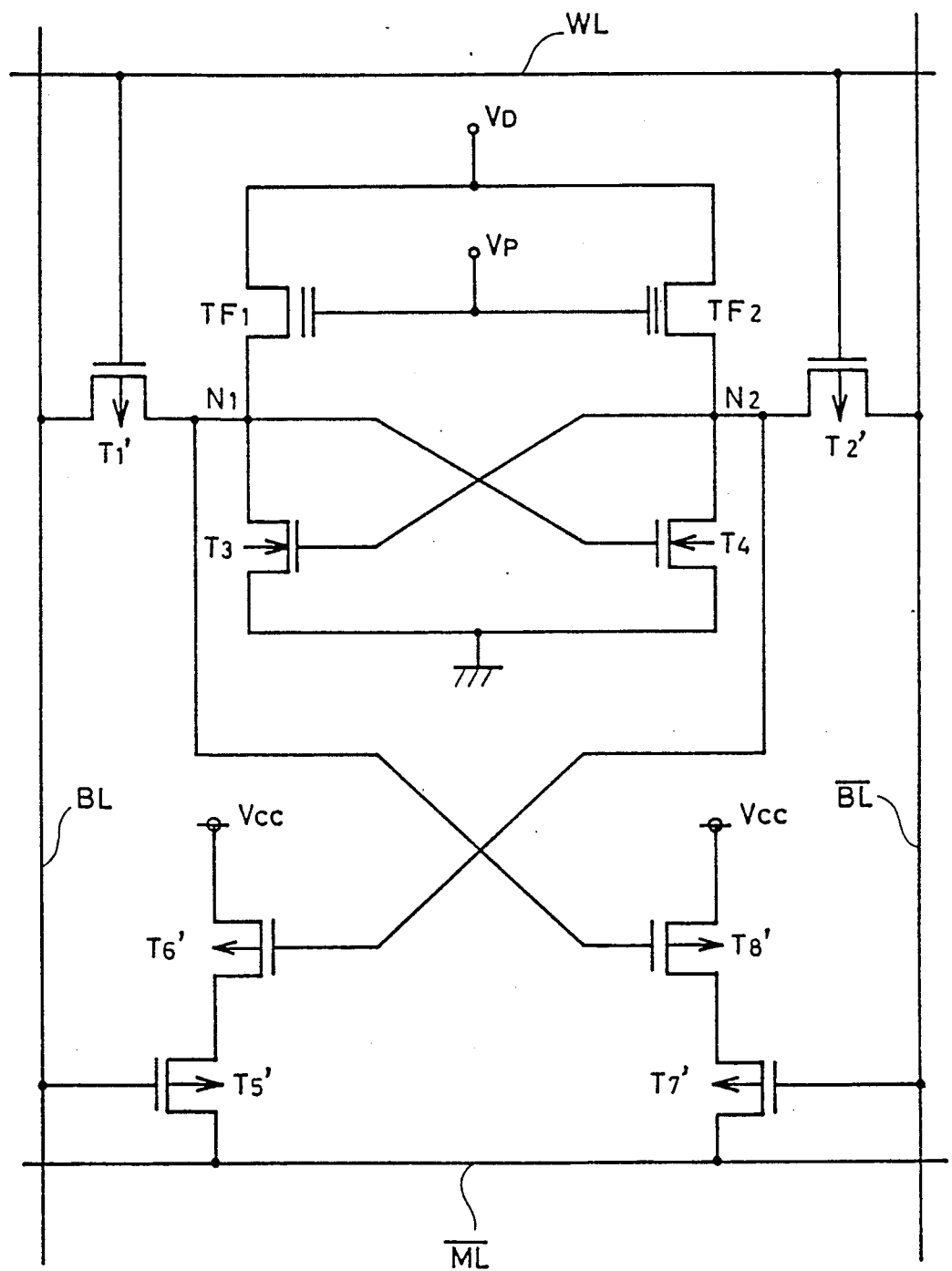

FIG. 17 is a circuit diagram showing a further embodiment of the present invention. In the CAM cell of FIG. 17, which is similar to the CAM cell shown in FIG. 14, first and second transfer gates T1' and T2' in an SRAM cell 100 are formed by p-MOS transistors. Further, fifth to eighth MOS transistors T5' to T8' are also of p-channel types. It may be understood that a word line WL may be brought into an "L" level in order to activate the transfer gates T1' and T2' in the CAM cell shown in FIG. 17. In order to make content reference operation, the match line ML is predischarged at the ground potential, and second conducting terminals of the sixth and eighth MOS transistors T6' and T8' are connected to a supply voltage $V_{CC}$. Thus, it may be understood that the CAM cell of FIG. 17 can also operate similarly to the CAM cell shown in FIG. 14.

Figure 18:
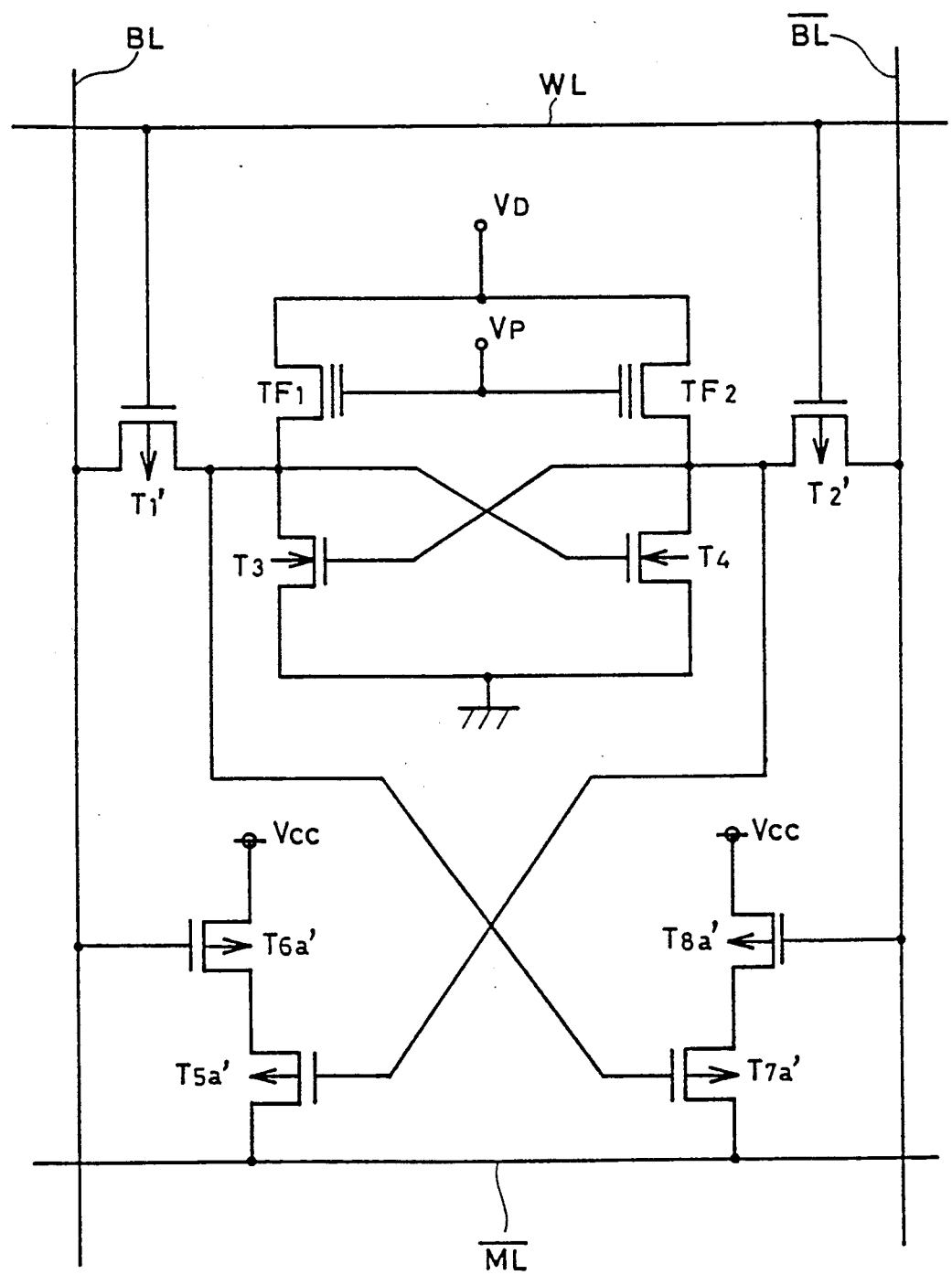

FIG. 18 is a circuit diagram showing a further embodiment of the present invention. In the CAM cell of FIG. 18, which is similar to the CAM cell shown in FIG. 16, first and second transfer gates T1' and T2' are formed by p-MOS transistors, and fifth to eighth MOS transistors T5' to T8' are also of p-channel types. It may be understood that the CAM cell of FIG. 18 can also be driven similarly to the CAM cell shown in FIG. 16.

When a pair of transfer gates in an SRAM cell 100 are formed by n-channel MOS transistors, it is preferable to precharge a pair of bit lines BL and $\overline{BL}$ at supply potential "H" levels before starting of reading for attaining large potential difference between the bit lines BL and $\overline{BL}$ after reading, in consideration of back gate effects of the transistors. When the pair of transistors are formed by p-channel MOS transistors to the contrary, it is preferable that the pair of bit lines BL and $\overline{BL}$ are predischarged before starting of reading in order to attain large potential difference between the pair of bit lines BL and $\overline{BL}$ after reading. When a pair of MOS transistors whose conducting states are controlled by a pair of bit lines BL and $\overline{BL}$ are of n-channel types in a content addressable circuit 200, on the other hand, the pair of bit lines BL and $\overline{BL}$ must be discharged at the ground potential before starting of content reference. This is because it is necessary to maintain the potential at the match line ML which is precharged before starting of content reference. When this pair of MOS transistors whose conducting states are controlled by the pair of bit lines BL and $\overline{BL}$ are of p-channel types to the contrary, the pair of bit lines BL and $\overline{BL}$ must be precharged at "H" levels before starting of content reference. This is because it is necessary to maintain the potential at the match line ML, which is predischarged before starting of content reference.

That is, when both of MOS transistors of a pair of transfer gates in the SRAM cell 100 and a pair of MOS transistors whose conducting states are controlled by the bit line pair BL and $\overline{BL}$ in the content addressable circuit 200 are of n-channel types, it is necessary to precharge the bit line pair in data reading, while it is necessary to predischarge the bit line pair in content reference operation. When both of the MOS transistors of the pair of transfer gates in the SRAM cell 100 and the pair of MOS transistors whose conducting states are controlled by the bit line pair BL and $\overline{BL}$ in the content addressable circuit 200 are of p-channel types, to the contrary, the bit line pair BL and $\overline{BL}$ must be predischarged in data reading and precharged in content reference operation.

Figure 19:
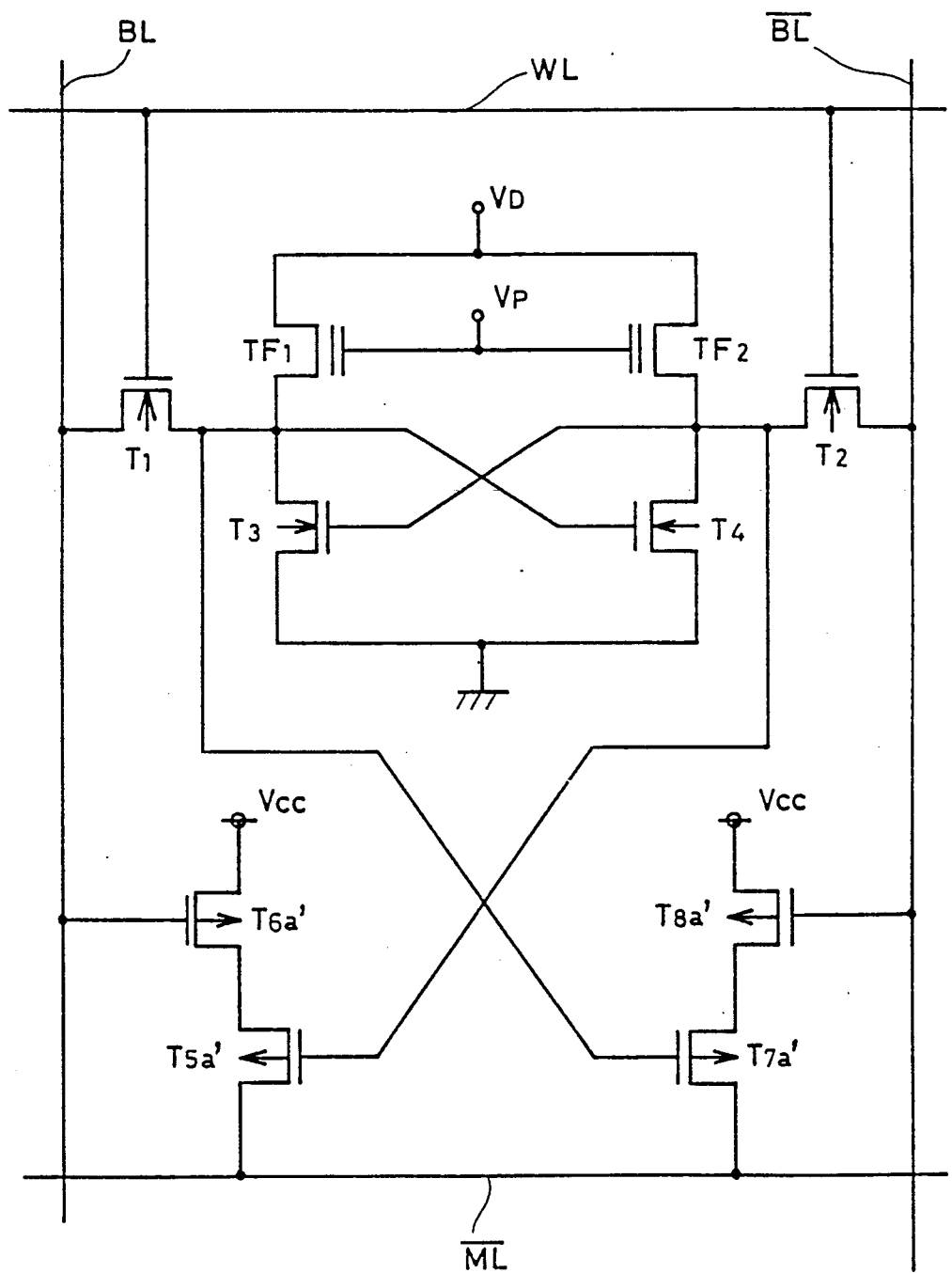

FIG. 19 is a circuit diagram showing a further embodiment of the present invention. In the CAM cell of FIG. 19, which is similar to the CAM cell shown in FIG. 18, a pair of transfer gates T1 and T2 in an SRAM cell 100 are formed by n-channel MOS transistors. On the other hand, four MOS transistors in a content addressable circuit are of p-channel types. In this content addressable memory cell, therefore, a pair of bit lines BL and $\overline{BL}$ are precharged in data reading while the pair of bit lines BL and $\overline{BL}$ are also precharged in content reference. Namely, it is not necessary to switch precharging and predischarging of the bit line pair BL and $\overline{BL}$ in response to change of operating modes, whereby power consumption can be reduced and the working speed can be improved.

Figure 20:
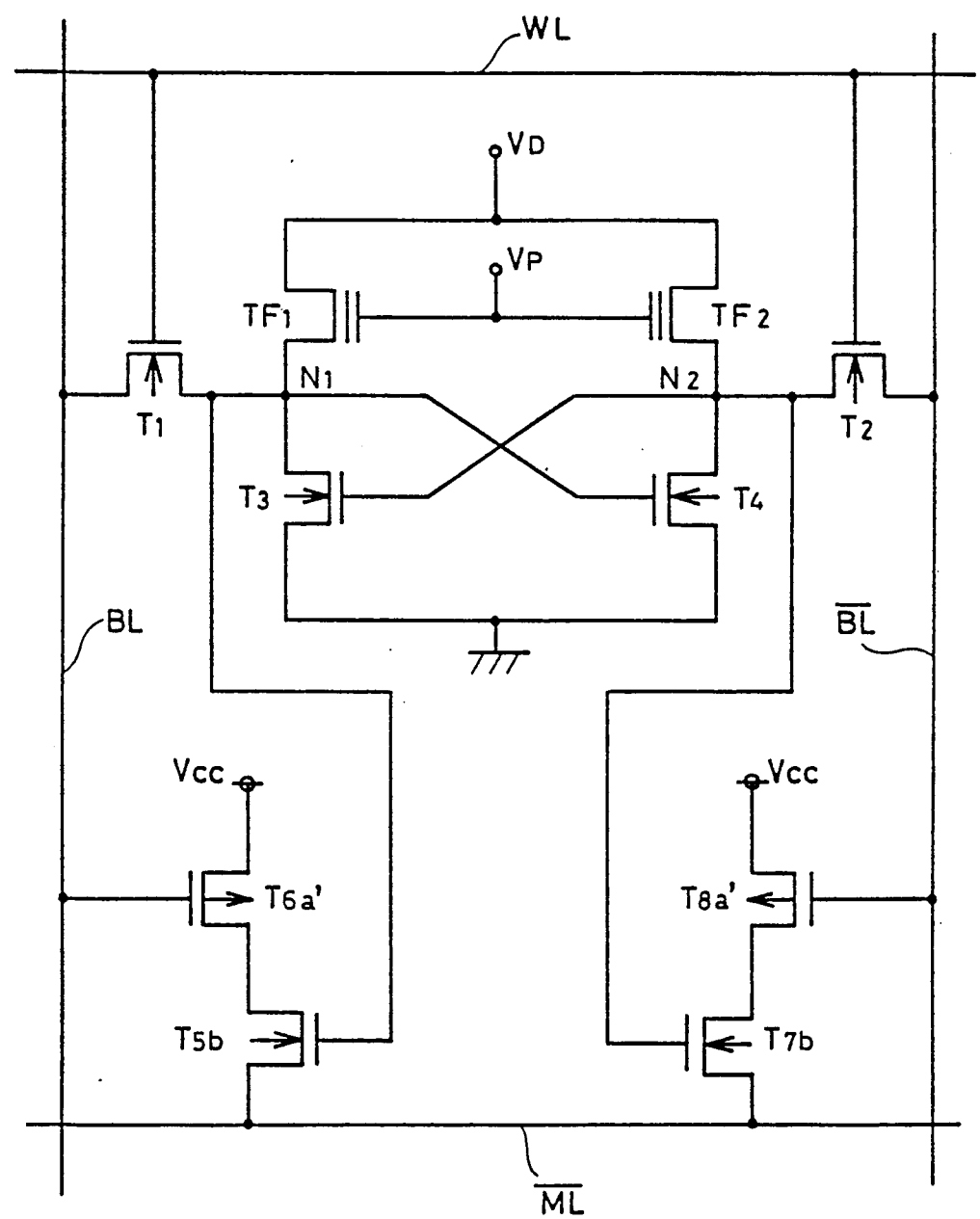

FIG. 20 is a circuit diagram showing a further embodiment of the present invention. In the CAM cell of FIG. 20, which is similar to the CAM cell shown in FIG. 19, fifth and seventh MOS transistors T5b and T7b are of n-channel types. Following this, a gate of the fifth MOS transistor T5b is connected to a first data node N1, and a gate of the seventh MOS transistor T7b is connected to a second data node N2. It may be understood that the CAM cell of FIG. 20 also operates similarly to the CAM cell shown in FIG. 19.

Figure 21:
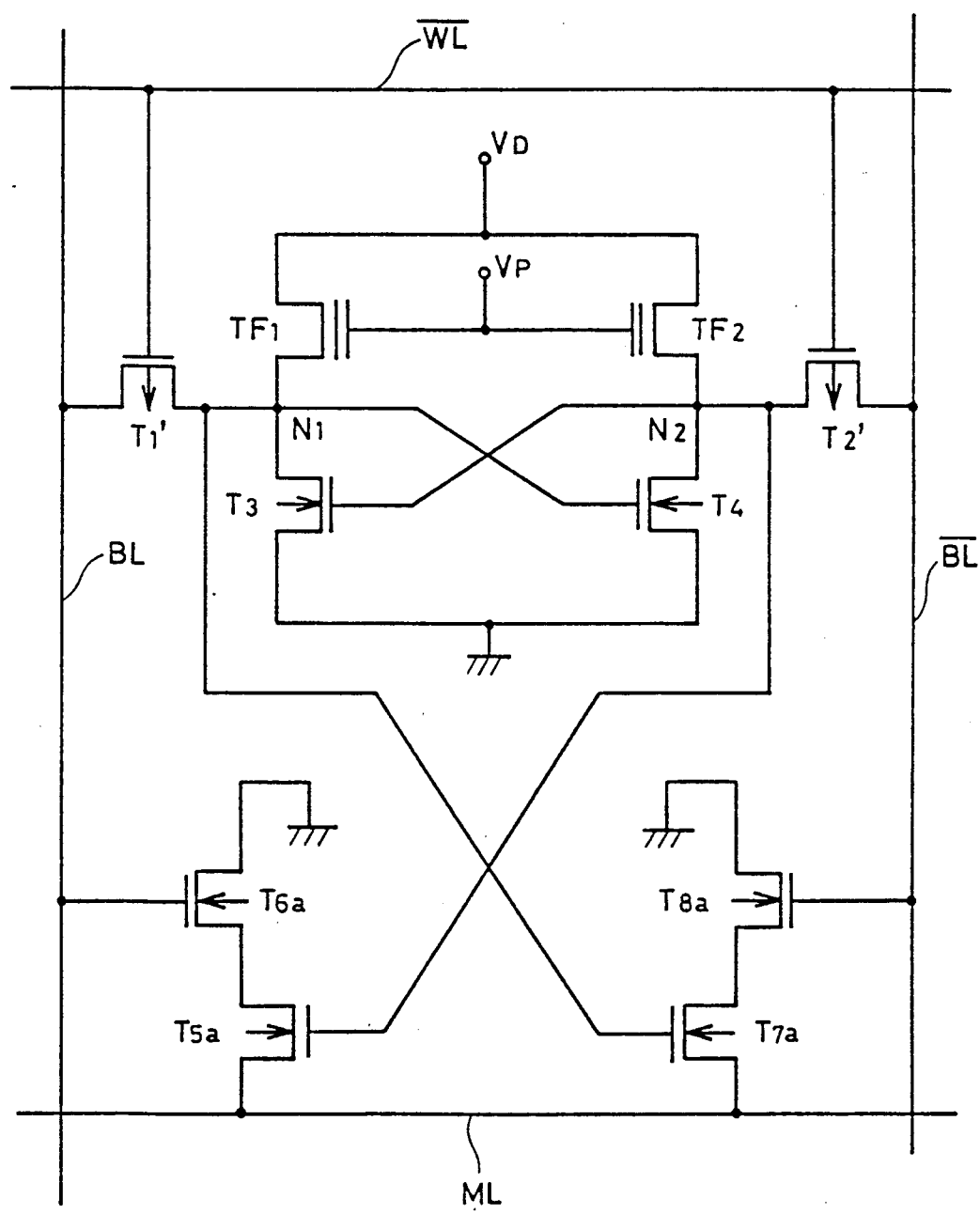

FIG. 21 is a circuit diagram showing a further embodiment of the present invention. In the CAM cell of FIG. 21, which is similar to the CAM cell shown in FIG. 16, a pair of transfer gates T1' and T2' in an SRAM cell 100 are formed by p-channel MOS transistors. It may be understood that the CAM cell of FIG. 21 can be also driven similarly to the CAM cell shown in FIG. 16.

Figure 22:
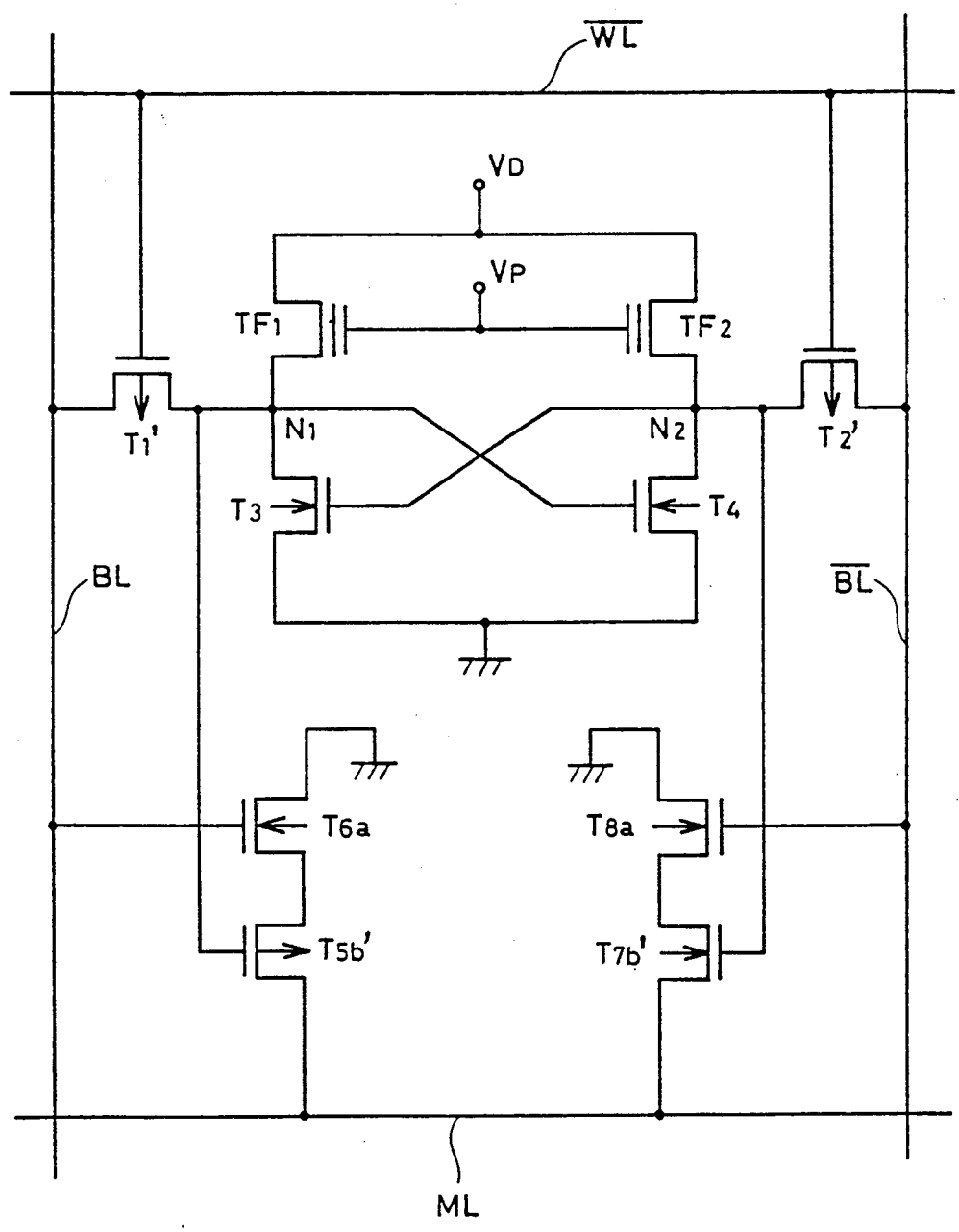

FIG. 22 is a circuit diagram showing a further embodiment of the present invention. In the CAM cell shown in FIG. 22, fifth and seventh MOS transistors T5b' and T7b' are of p-channel types. Following this, a gate of the fifth MOS transistor T5b' is connected to a first data node N1, and a gate of the seventh MOS transistor T7b' is connected to a second data node N2. It may be understood that the CAM cell of FIG. 22 can also be driven similarly to the CAM cell shown in FIG. 21.

Figure 23:
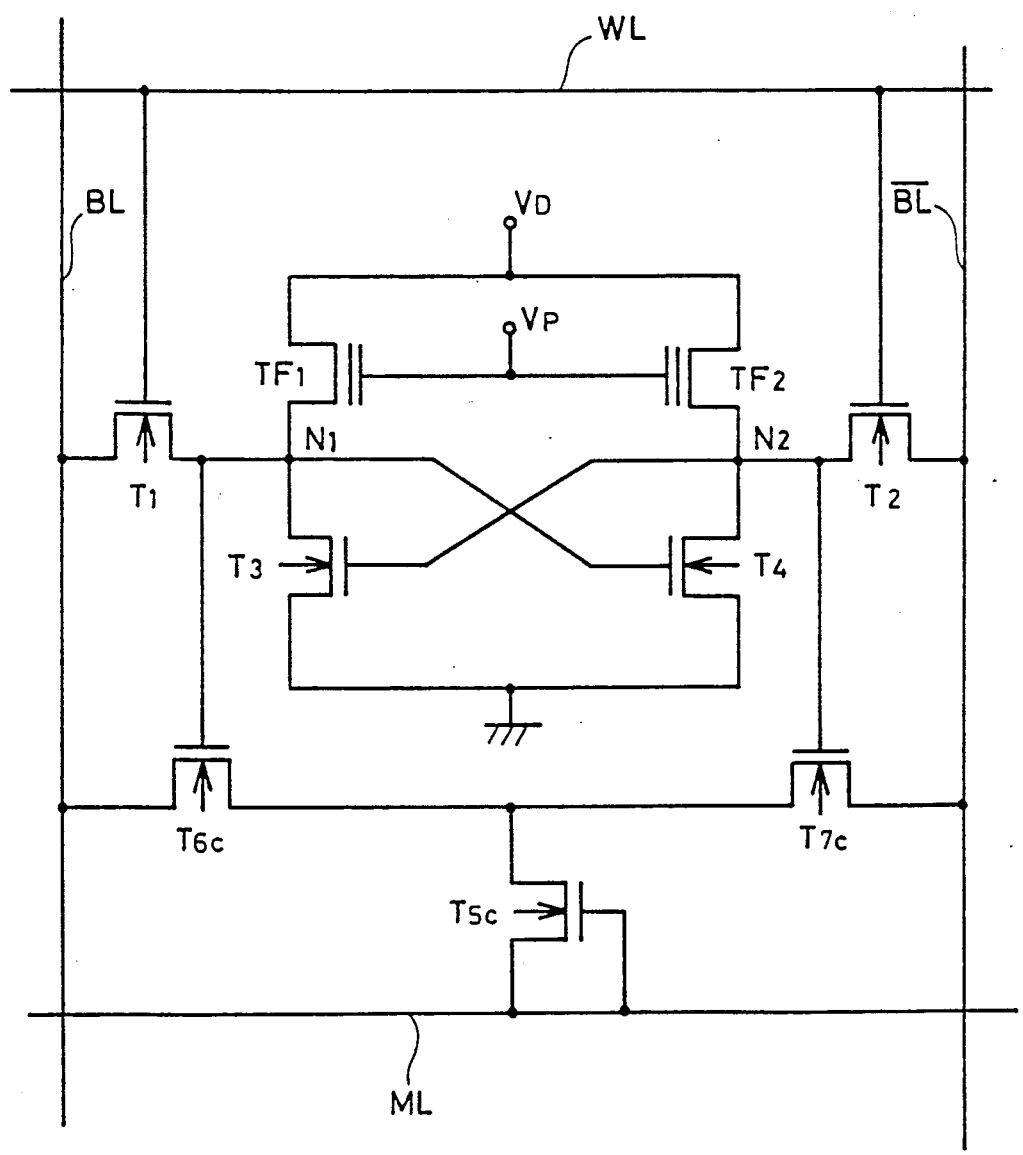

FIG. 23 is a circuit diagram showing a further embodiment of the present invention. In the CAM cell shown in FIG. 23, a content addressable circuit 200 is formed by only three MOS transistors. That is, a first conducting terminal and a gate of a fifth n-MOS transistor T5c are commonly connected to a match line ML, and its second conducting terminal is commonly connected to first conducting terminals of sixth and seventh n-MOS transistors T6c and T7c. A gate of the sixth n-MOS transistor T6c is connected to a first data node N1, and its second conducting terminal is connected to a first bit line BL. A gate of the seventh n-MOS transistor T7c is connected to a second data node N2, and its second conducting terminal is connected to a second bit line $\overline{BL}$.

In this CAM cell, a pair of transfer gates T1 and T2 are formed by n-MOS transistors, and hence it is desirable to precharge the pair of bit lines BL and $\overline{BL}$ before starting of data reading. Supposing that data of "1" ("H" level node N1 and "L" level node N2) is stored in content reference, on the other hand, the sixth n-MOS transistor T6c is in a conducting state and the seventh n-MOS transistor T7c is in a non-conducting state. Therefore, the pair of bit lines BL and $\overline{BL}$ may be precharged before starting of content reference similarly to the operation before starting of reading. Namely, it is not necessary to switch precharging and predischarging of the bit line pair BL and $\overline{BL}$ in response to operating modes. Thus, power consumption can be reduced and the working speed can be improved.

The match line ML is precharged after the pair of bit lines BL and $\overline{BL}$ are precharged in content reference. Supposing that reference data of "1" ("H" level BL and "L" level $\overline{BL}$) is supplied to the bit line pair BL and $\overline{BL}$, the precharged potential of the match line ML is held since the first bit line BL is at an "H" level although the sixth n-MOS transistor T6c is in a conducting state. Thus, it is understood that the content reference data matches the stored data.

When reference data "0" is supplied, on the other hand, the first bit line BL enters an "L" level and hence charges are extracted from the match line ML to the first bit line BL through the fifth and sixth n-MOS transistors T5c and T6c. Thus, the potential at the match line ML is lowered and it is recognized that the content reference data mismatches the stored data.

Figure 24:
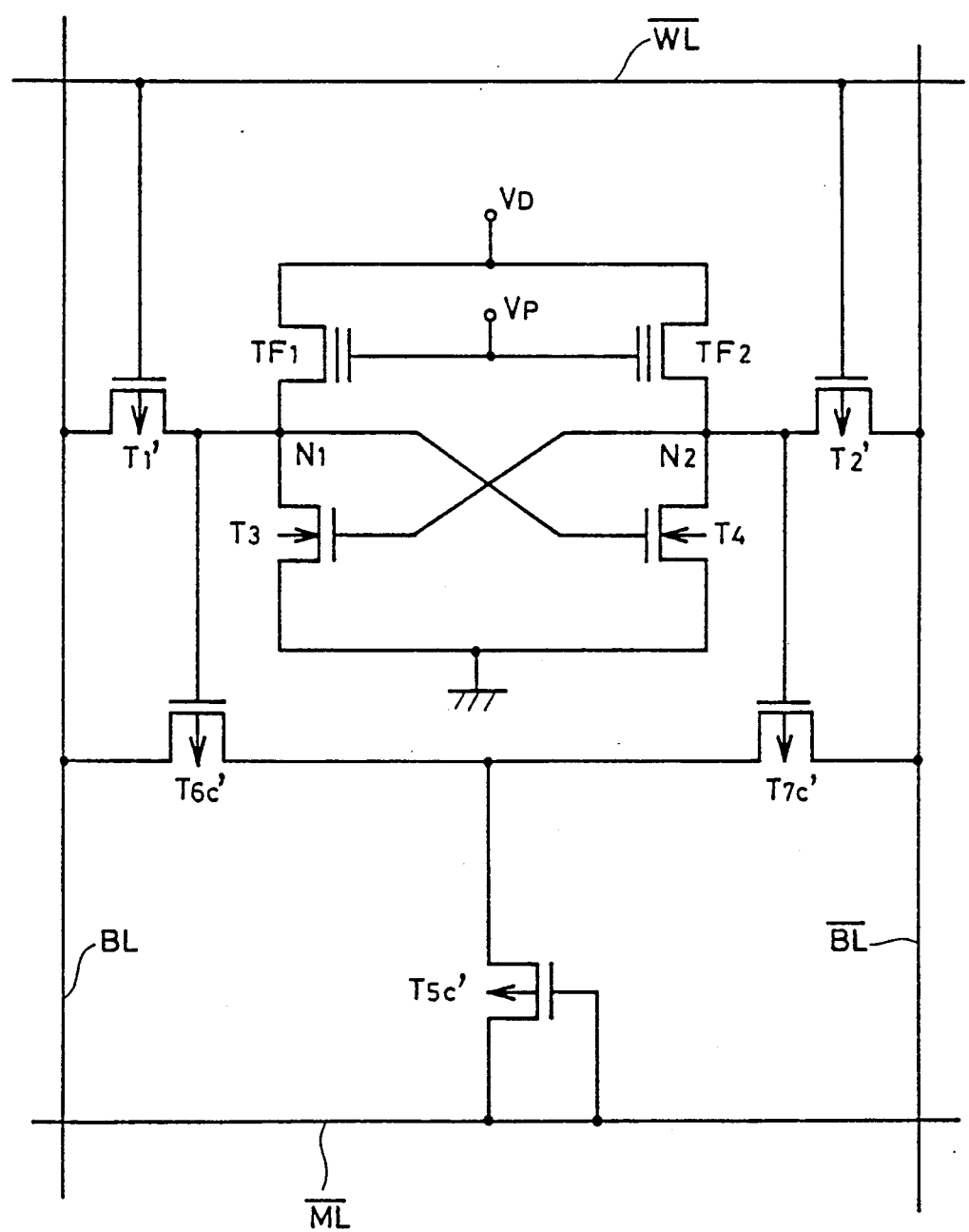

FIG. 24 is a circuit diagram showing a further embodiment of the present invention. In the CAM cell of FIG. 24, which is similar to the CAM cell shown in FIG. 23, a pair of transfer gates T1' and T2' are formed by p-MOS transistors, while three MOS transistors T5c', T6c' and T7c' within a content addressable circuit are of p-channel types. In this memory cell, a bit line pair BL and $\overline{BL}$ may be predischarged and a word line WL may be brought into an "L" level in reading. Further, it may be understood that the bit line pair BL and $\overline{BL}$ may be predischarged and the match line ML may be brought into an "L" level before starting of content reference. Namely, also in the memory cell shown in FIG. 24, it is not necessary to switch precharging and predischarging of the bit line pair BL and $\overline{BL}$ in response to operating modes.

Figure 25:
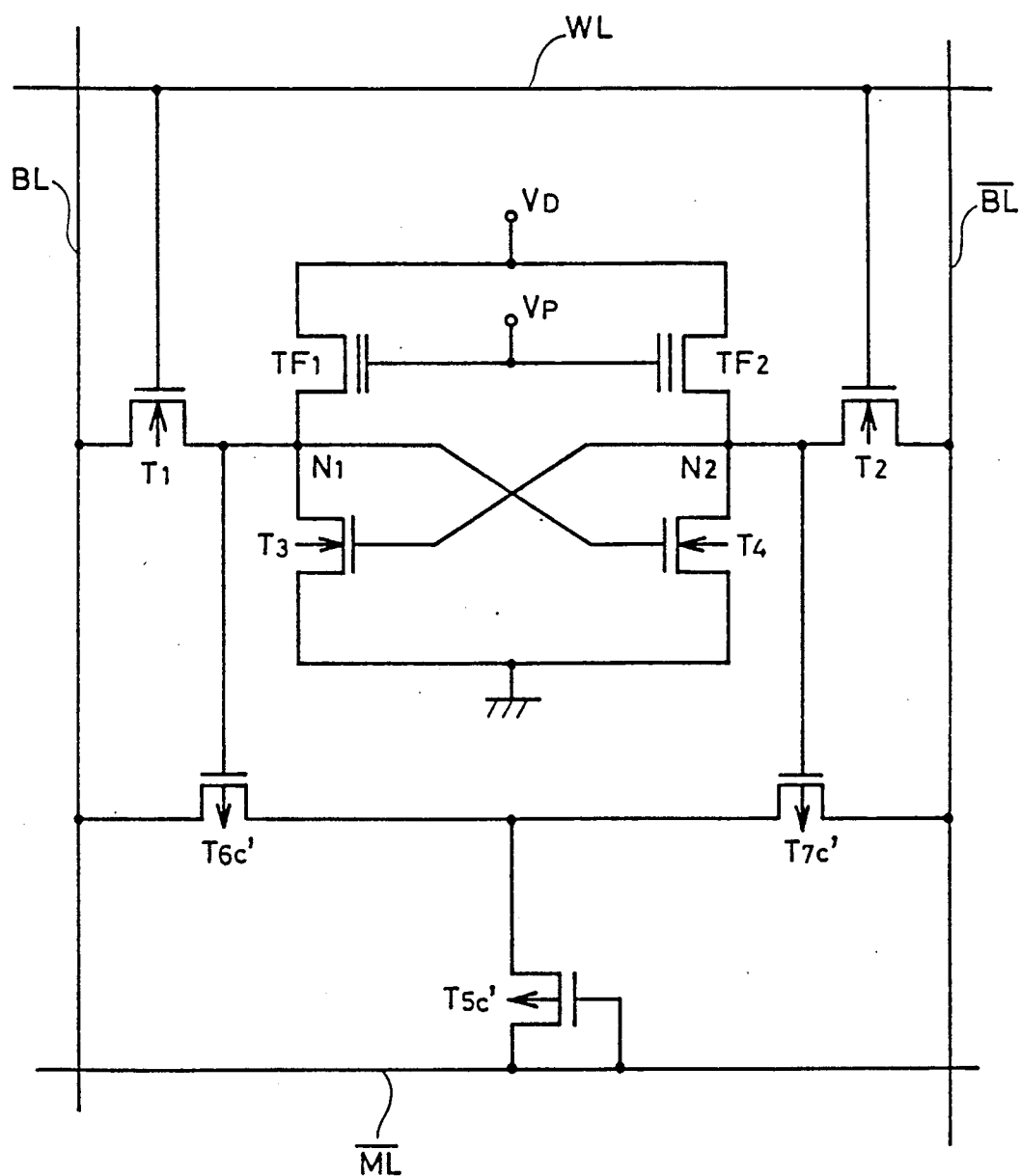

FIG. 25 is a circuit diagram showing a further embodiment of the present invention. In the CAM cell of FIG. 25, which is similar to the CAM cell shown in FIG. 23, only three MOS transistors T5c', T6c' and T7c' within a content addressable circuit 200 are of p-channel types. It will be understood that, in this memory cell, it is desirable to precharge a pair of bit lines BL and $\overline{BL}$ before starting of reading while the bit line pair BL and $\overline{BL}$ must be predischarged before starting of content reference. In the CAM cell shown in FIG. 25, therefore, precharging and predischarging of the bit line pair BL and $\overline{BL}$ must be switched in response to operating modes, and this cell is slightly disadvantageous as compared with the CAM cell shown in FIG. 23, in consideration of power consumption and the operating speed.

Figure 26:
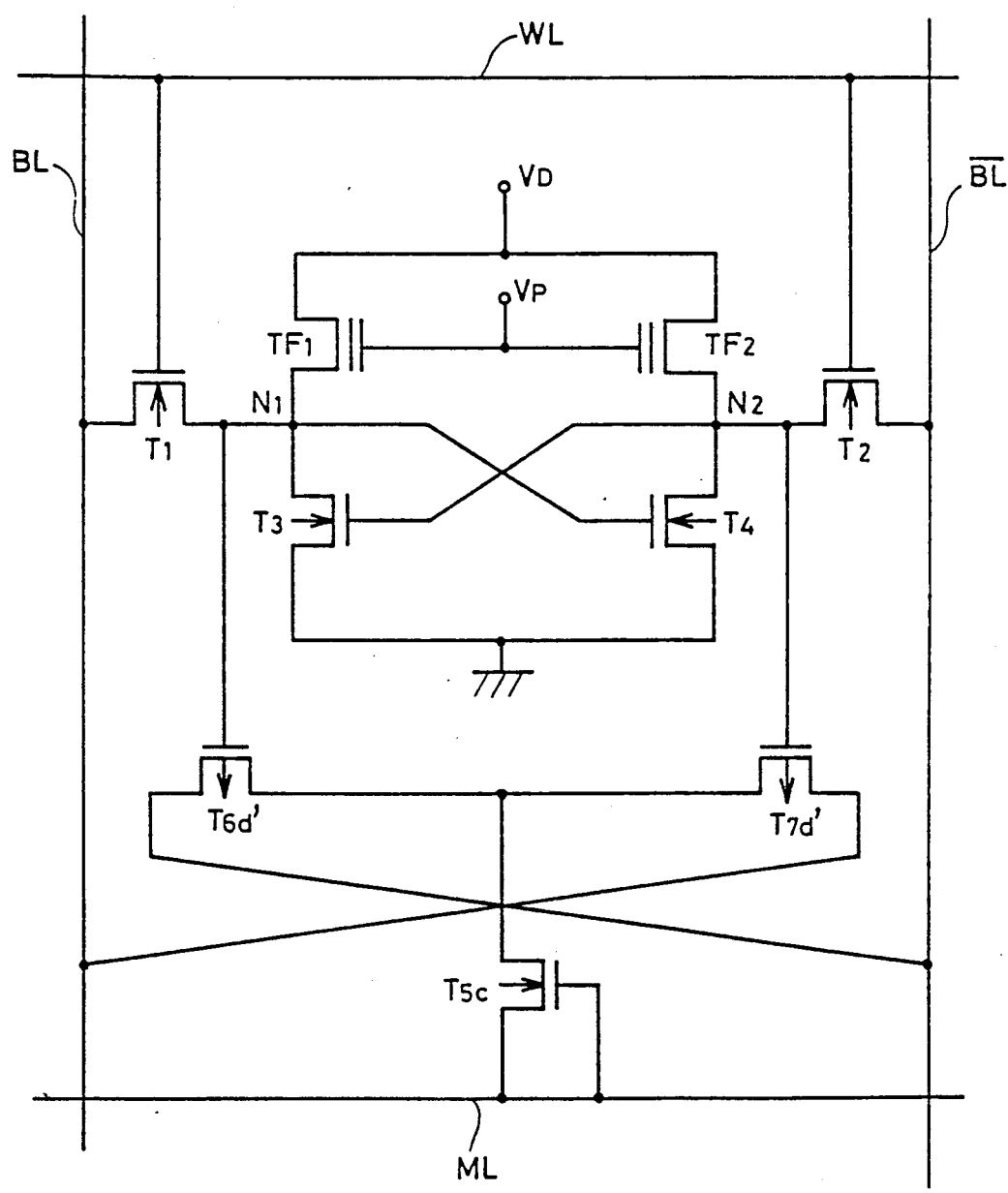

FIG. 26 is a circuit diagram showing a further embodiment of the present invention. In the CAM cell of FIG. 26, which is similar to the CAM cell shown in FIG. 23, sixth and seventh MOS transistors T6d' and T7d' are of p-channel types. Following this, a second conducting terminal of the sixth MOS transistor T6d' is connected to a second bit line $\overline{BL}$ and a second conducting terminal of the seventh MOS transistor T7d' is connected to a first bit line BL. It may be understood that, in this CAM cell, it is desirable to precharge the pair of bit lines BL and $\overline{BL}$ before data reading and the bit line pair BL and $\overline{BL}$ must be precharged before starting of content reference. Namely, it is not necessary to switch precharging and predischarging of the bit line pair BL and $\overline{BL}$ in response to operating modes in the CAM cell of FIG. 26, similarly to the CAM cell shown in FIG. 23.

Figure 27:
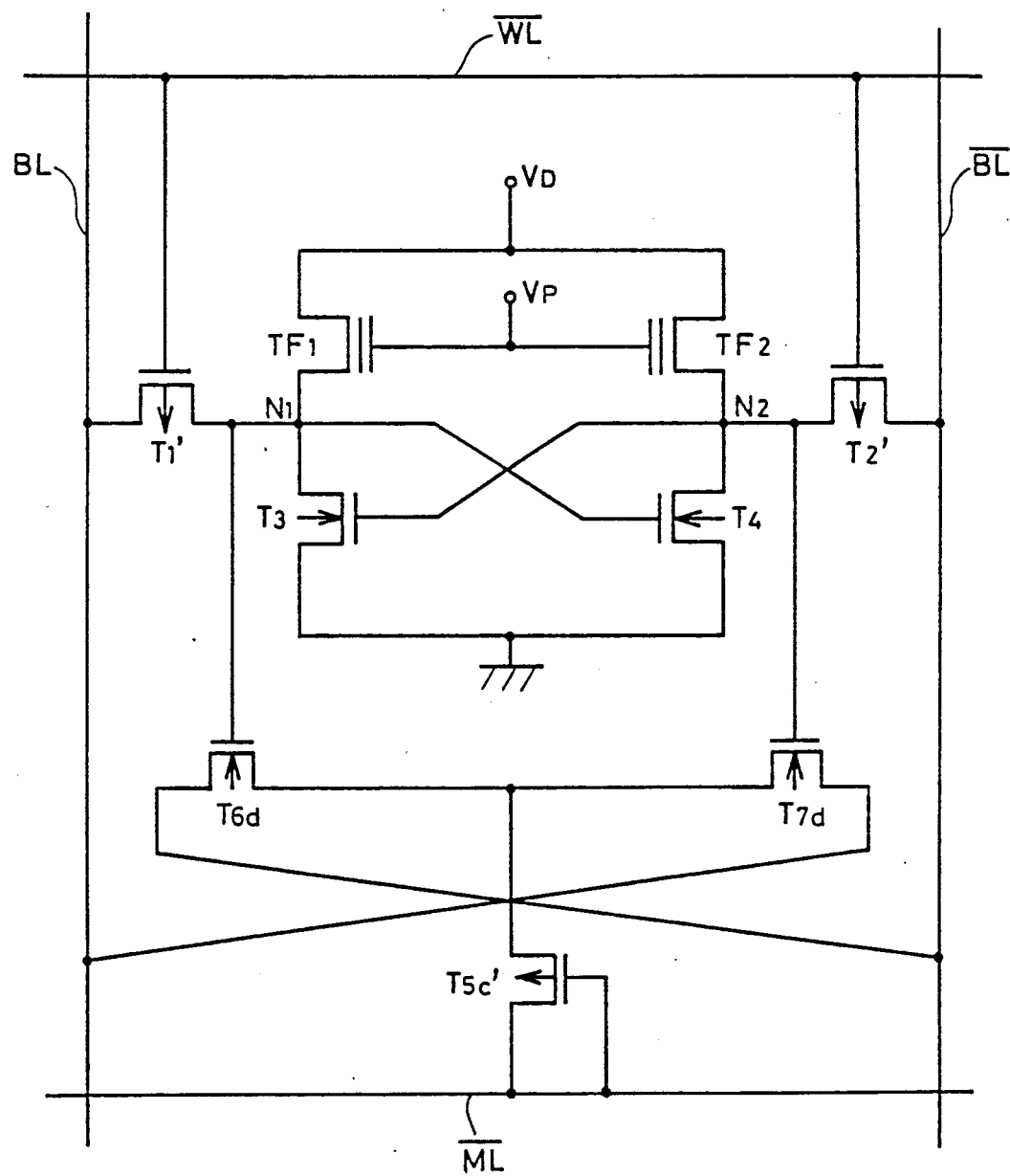

FIG. 27 is a circuit diagram showing a further embodiment of the present invention. In the CAM cell of FIG. 27, which is similar to the CAM cell shown in FIG. 24, sixth and seventh MOS transistors T6d and T7d are of n-channel types. Following this, a second conducting terminal of the sixth MOS transistor T6d is connected to a second bit line $\overline{BL}$, and a second conducting terminal of the seventh MOS transistor T7d is connected to a first bit line BL. It may be understood that, in this CAM cell, it is desirable to predischarge the bit line pair BL and $\overline{BL}$ before data reading and the bit line pair BL and $\overline{BL}$ must be predischarged before starting of content reference. Namely, it is not necessary to switch precharging and predischarging of the bit line pair BL and $\overline{BL}$ in response to operating modes in this CAM cell, similarly to the CAM cell shown in FIG. 24.

In the CAM cells shown in the aforementioned embodiments, every memory cell can be weighted by making the bit line voltage in writing variable or making the write time variable, and it is possible to thereby implement a memory cell which is suitable for an associative system allowing ambiguity.

Figure 37:
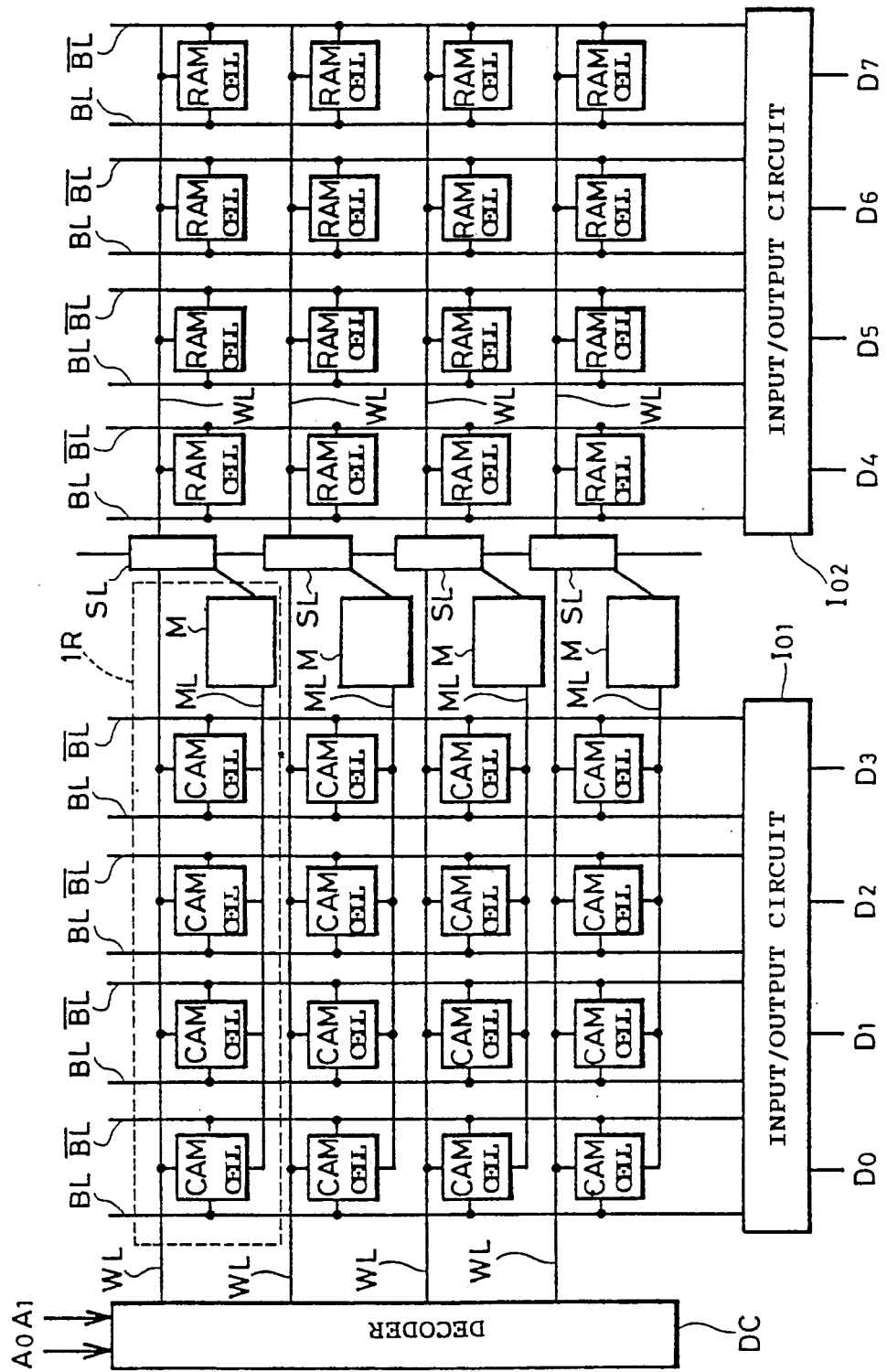
FIG. 37 is a block diagram showing an example of a conventional CAM system.

A CAM system according to a further embodiment of the present invention is now described. In the following embodiment, overall structure of a CAM cell array may be similar to that of the prior art shown in FIG. 37. The feature of this embodiment resides in that match/mismatch detection, which has been performed in the match/mismatch detection circuit M shown in FIG. 37, is performed by a current-voltage conversion circuit 20 and a voltage sensing circuit 30, as shown in FIG. 28.

Figure 28:
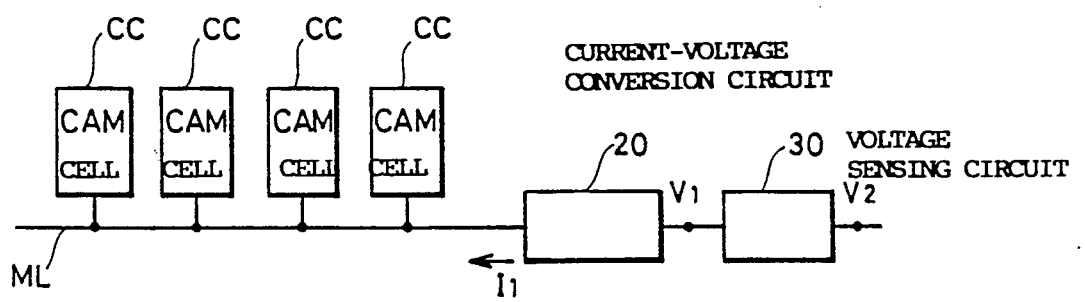
FIG. 28 is a schematic block diagram showing a CAM system according to a further embodiment of the present invention.
Figure 29:
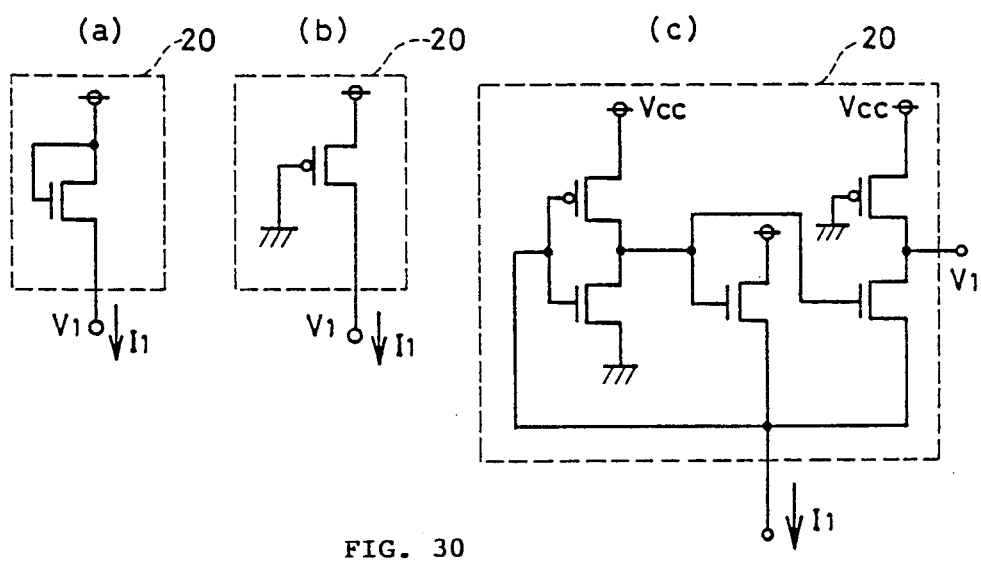
FIG. 29 is a diagram showing exemplary circuit structure of a current-voltage conversion circuit 20 shown in FIG. 28.
Figure 30:
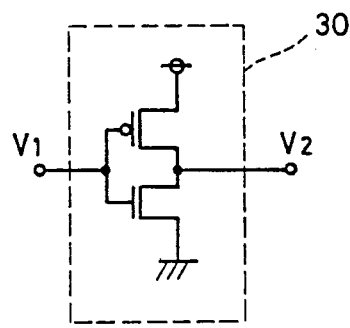
FIG. 30 is a diagram showing exemplary circuit structure of a voltage sensing circuit 30 shown in FIG. 28.

Referring to FIG. 28, the current-voltage conversion circuit 20 is adapted to convert a current I1 flowing into the ground potential of a mismatching bit CAM cell CC through a match line ML into a voltage value. While a variety of generally known circuit structures can be employed for such a current-voltage conversion circuit 20, three circuit structure examples are shown in FIGS. 29 (a), (b) and (c), for reference. On the other hand, the voltage sensing circuit 30 is adapted to compare an output voltage V1 of the current-voltage conversion circuit 20 with a prescribed threshold voltage. That is, an output voltage V2 of the voltage sensing circuit 30 is inverted between an "H" level and an "L" level depending on whether the output voltage V1 of the current-voltage conversion circuit 20 is higher or lower than the said prescribed threshold voltage. A CMOS inverter is employed for such a voltage sensing circuit 30 as shown in FIG. 30, for example. Further, other circuit structure may be employed so far as the same has the aforementioned comparing function.

Figure 38:
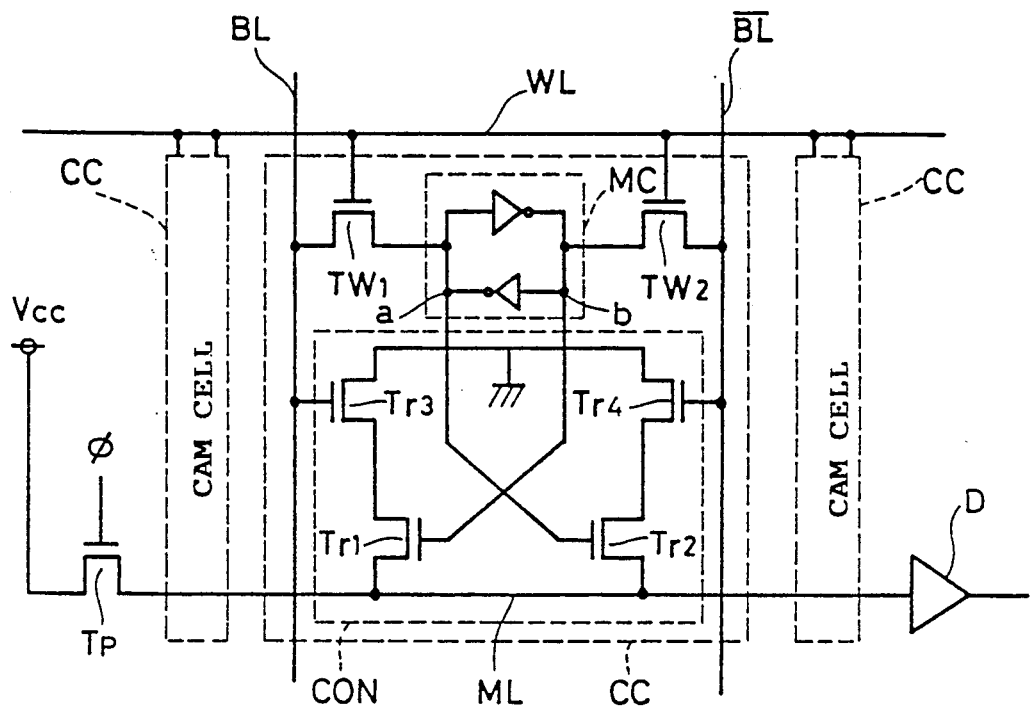
FIG. 38 is a circuit diagram showing the detail of a portion 1R enclosed by dotted lines in FIG. 37.
Figure 39:
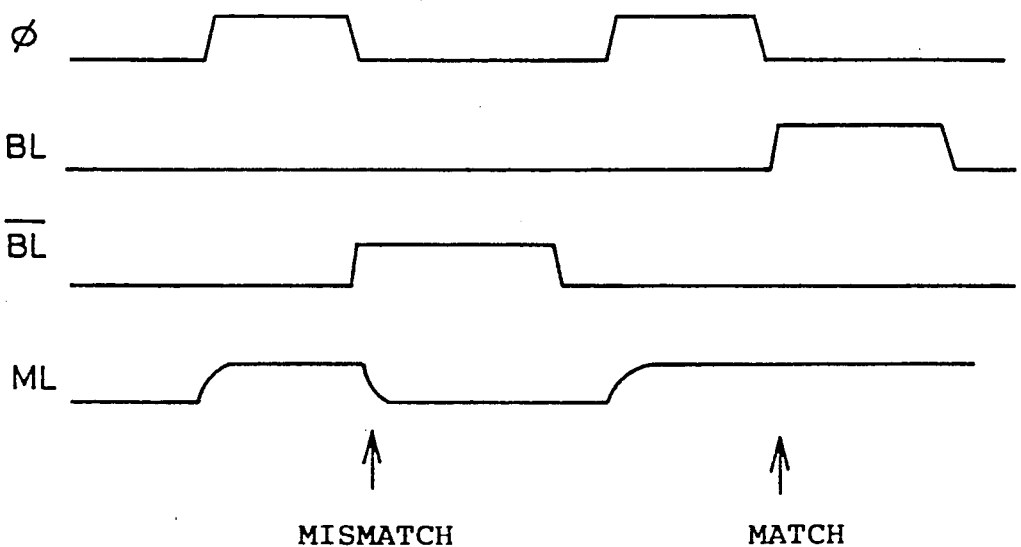
FIG. 39 is a timing chart for illustrating the operation of the conventional CAM system shown in FIGS. 37 and 38.

Operation of the embodiment shown in FIG. 28 is now described. In this embodiment, information writing operation in each CAM cell CC and operation for comparing storage information in each CAM cell CC with reference information supplied through bit lines BL and $\overline{BL}$ are similar to those of the prior art shown in FIGS. 37 and 38. That is, this embodiment is different in match/mismatch detection operation (i.e., operation for detecting whether or not storage information matches reference information in view of a single row as a whole), which has been performed in the match/mismatch detection circuit M shown in FIG. 37. Therefore, the match/mismatch detection operation is hereafter described.

Figure 31:
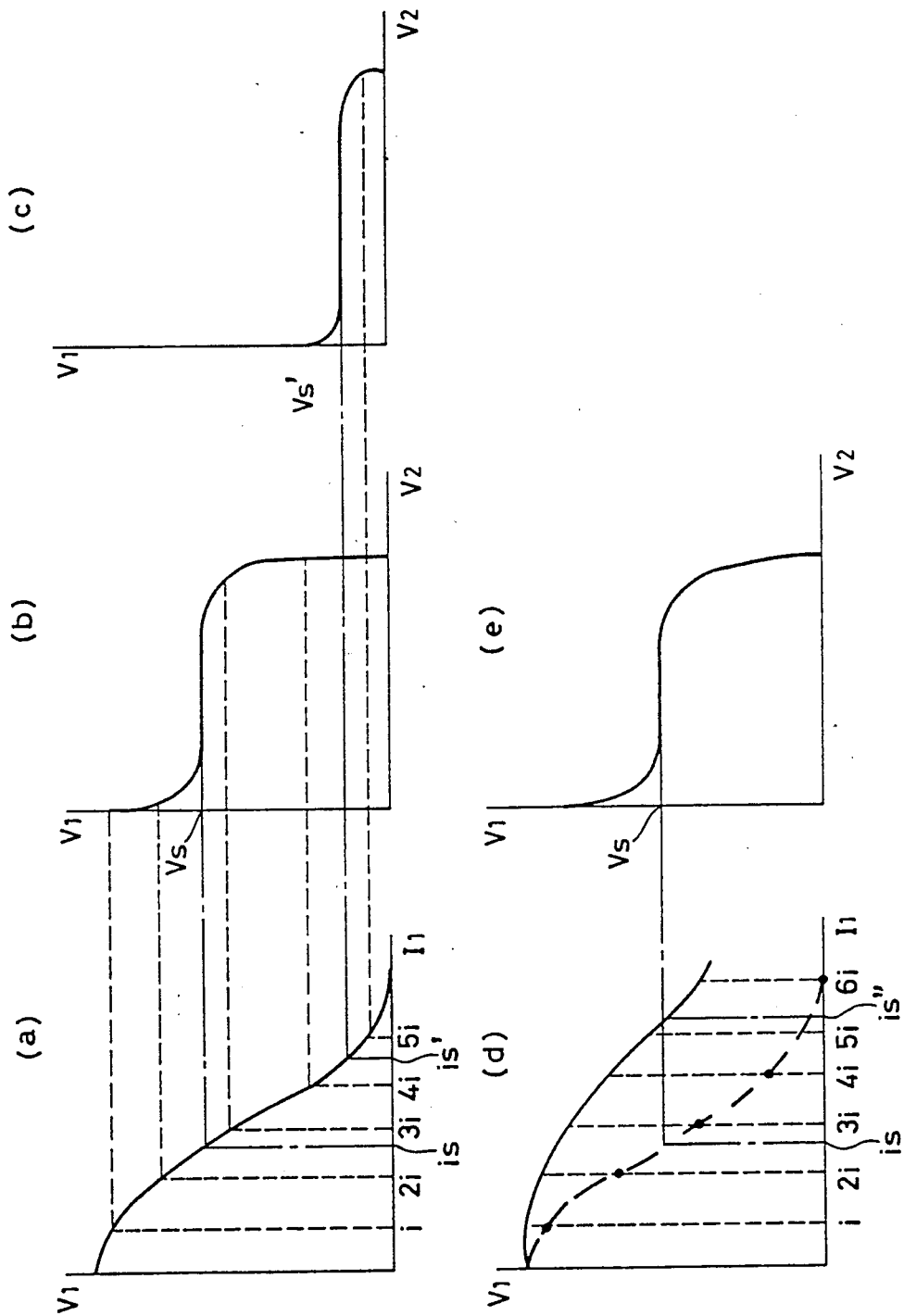
FIG. 31 is a waveform diagram showing current-voltage conversion characteristics of the current-voltage conversion circuit 20 shown in FIG. 28 and input-/output characteristics of the voltage sensing circuit 30.
Figure 32:
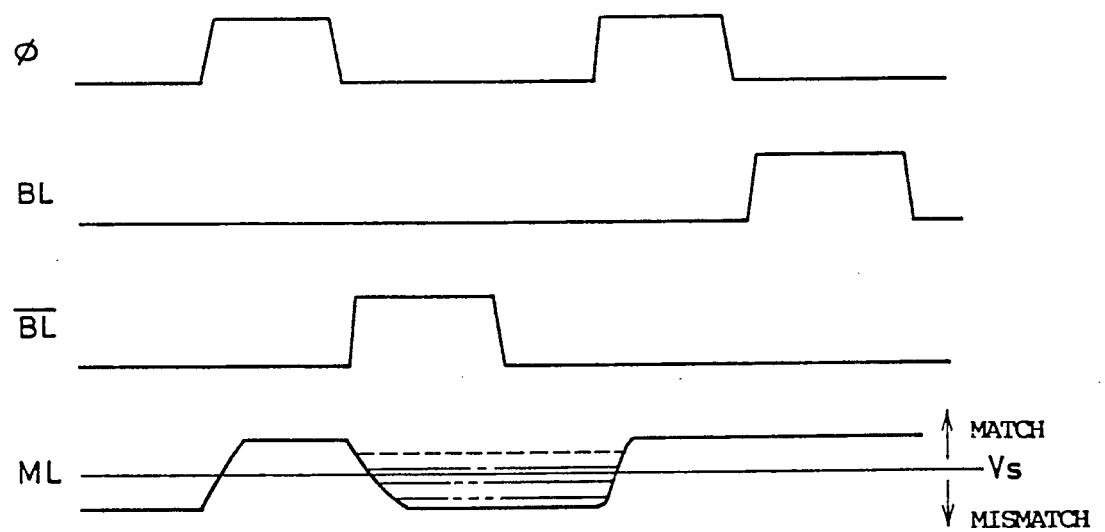
FIG. 32 is a timing chart for illustrating the operation of the embodiment shown in FIG. 28.

FIG. 31 shows waveform diagrams illustrating current vs. voltage conversion characteristics of the current-voltage conversion circuit 20 shown in FIG. 28 and input/output characteristics of the voltage sensing circuit 30. FIGS. 31(a) and (d) show the current vs. voltage conversion characteristics of the current-voltage conversion circuit 20, and FIGS. 31(b), (c) and (e) show the input/output characteristics of the voltage sensing circuit 30. It is assumed that i represents the value of a current extracted from a match line ML when one CAM cell CC is mismatching. Referring to FIGS. 31(a) and (b), a current value is in the current-voltage conversion circuit 20 corresponding to a threshold voltage Vs in the voltage sensing circuit 30 is set as $2i < is < 3i$. In this case, the voltage sensing circuit 30 can regard that matching is attained as a whole even if there are two mismatching bits in the same row. As shown in FIG. 32, the case of one mismatching bit is expressed by a dotted line and the case of two mismatching bits is expressed by a one-dot chain line, while the case of three mismatching bits is expressed by a two-dot chain line and the case of four mismatching bits is expressed by a three-dot chain line.

When the voltage sensing circuit 30 is formed by a CMOS inverter as shown in FIG. 30, its threshold value is determined by the ratio of driving ability of a p-channel MOS transistor forming the inverter to that of an n-channel MOS transistor. Therefore, the threshold voltage in the voltage sensing circuit 30 can be changed by changing the sizes of these transistors. When the threshold voltage of the voltage sensing circuit 30 is changed to Vs' as shown in FIG. 31(c), for example, a corresponding current value in the current-voltage conversion circuit 20 is is'. Since this current value is' is within a range of $4i < is' < 5i$, it can be regarded that matching is attained as a whole so far as the number of mismatching bits in the same row is up to four in this case.

On the other hand, it is also possible to change redundancy by changing the sizes of the transistors forming the current-voltage conversion circuit 20 to change the current-voltage conversion characteristics of the current-voltage conversion circuit 20. When the current-voltage conversion characteristics of the current-voltage conversion circuit 20 are set as shown by the sold line in FIG. 31(d), for example, a current value corresponding to the threshold voltage Vs of the voltage sensing circuit 30 shown in FIG. 31(e) is a current value is" in FIG. 31(d). Since this current value is" is within a range of $5i < is" < 6i$, it can be regarded that matching is attained as a whole if mismatching bits in the same row are not more than five bits in this case.

Thus, it is possible to change redundancy by changing the current-voltage conversion characteristics of the current-voltage conversion circuit 20 and/or the threshold voltage of the voltage sensing circuit 30, as hereinabove described. However, the aforementioned embodiment includes such a problem that it is difficult to set the current value is when a value m is increased in the current value is which is defined by $mi < is < (m+1)$ since the current-voltage conversion characteristics of the current-voltage conversion circuit 20 and the threshold voltage of the voltage sensing circuit 30 tend to disperse in fabrication steps.

Figure 33:
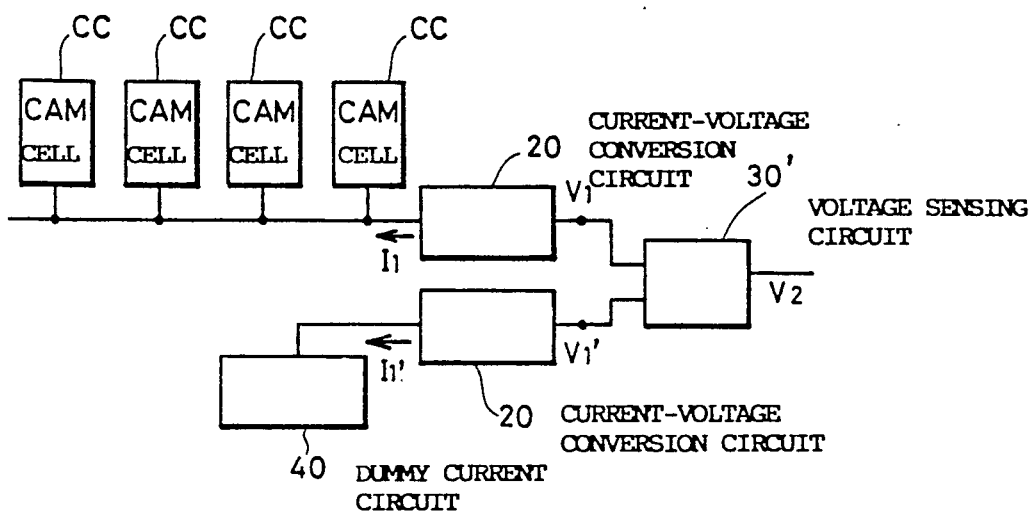
FIG. 33 is a schematic block diagram showing a CAM system according to a further embodiment of the present invention.
Figure 34:
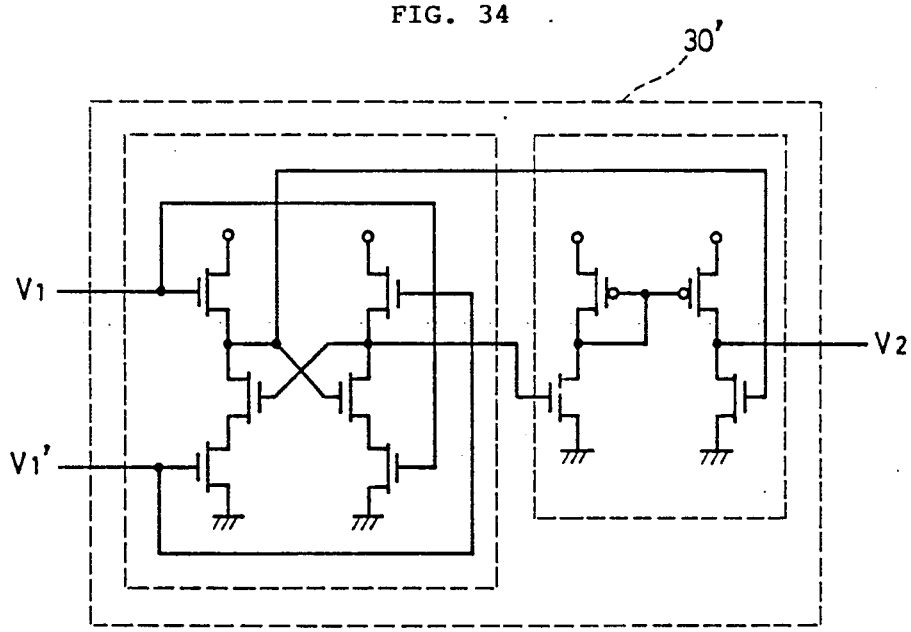
FIG. 34 is a diagram showing exemplary circuit structure of a voltage sensing circuit 30' shown in FIG. 33.
Figure 35:
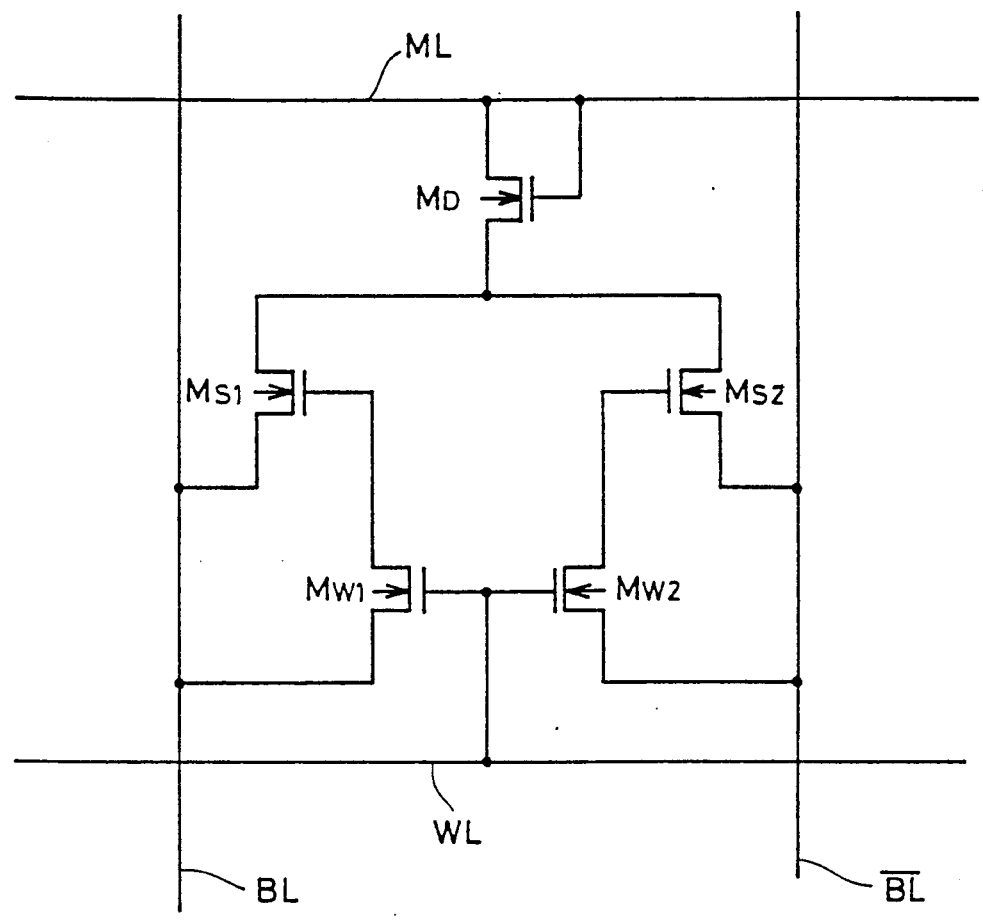
FIGS. 35 and 36 are circuit diagrams showing CAM cells according to the prior art.
Figure 36:
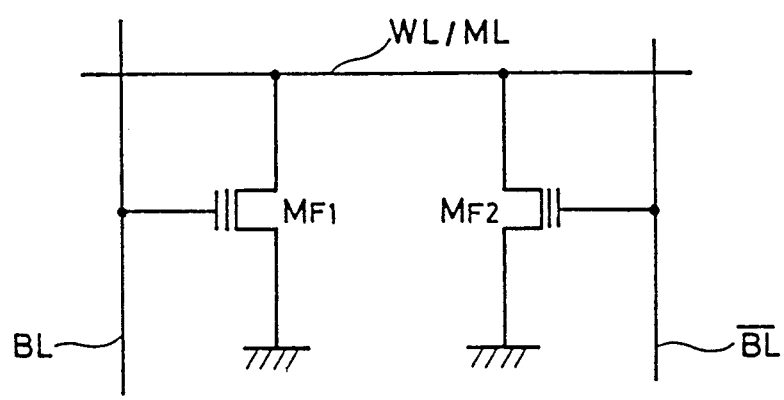

Then, it is possible to increase resolution of matching decision by further adding a reference voltage circuit which is formed by a dummy current circuit 40 and a second current-voltage conversion circuit 20' as shown in FIG. 33 and forming the voltage sensing circuit 30 as a differential type sense amplifier 30' shown in FIG. 34, for example. Further, the number of mismatching bits forming the limit of matching decision can be controlled from the exterior by employing a system of setting the current value of the dummy current circuit 40 by an external signal.

Referring to FIG. 33, it is preferable to make the second current-voltage conversion circuit 20' identical to the first current-voltage conversion circuit 20 not only in transistor size but in layout pattern, in order to cancel dispersion on the fabrication steps. Further, it is preferable to structure the reference voltage generating circuit formed by the dummy current circuit 40 and the second current-voltage conversion circuit 20' commonly to the overall rows or a plurality of rows, in order to simplify the circuit structure.

Although the number of mismatching bits forming the limit of matching decision, i.e., redundancy, is made variable by changing the current-voltage conversion circuit 20 of the match line and the transistor sizes of the voltage sensing circuit 30 in the aforementioned embodiment of the CAM system, every bit can be weighted by changing the sizes of transistors Tr1, Tr2, Tr3 and Tr4 (refer to FIG. 38) for performing comparison in each CAM cell CC. Further, every bit can be also weighted by changing bit line voltage in information reference every cell, since ON resistance values of the transistors Tr3 and Tr4 are changed and an extracted current of the match line ML is changed.

INDUSTRIAL AVAILABILITY

The present invention can provide a CAM cell, which can hold storage data and directly read out stored data from a bit line pair even if power is cut off. Further, the CAM cell according to the present invention can operate with low power consumption and at a high speed.

According to the present invention, the CAM system converts values of currents flowing into cells of mismatching bits through a match line into voltage values to decide match/mismatch with respect to reference information in the same row on the basis of largeness/smallness of the values, whereby it can be regarded that matching is attained as a whole even if there are some mismatching bits in the same row, so far as the number thereof is not more than a prescribed number. Consequently, the CAM system can be applied to a system having redundancy such as an associative system for example, and its application range can be extremely widened a compared with the prior art.

We claim:

1. A content addressable memory cell including:
   a first insulated gate field effect transistor having a first conducting terminal connected to a first bit line of a bit line pair, a control terminal connected to a word line, and a second conducting terminal,
   a second insulated gate field effect transistor having a first conducting terminal connected to a second bit line of said bit line pair, a control terminal connected to the word line, and a second conducting terminal,
   a first non-volatile memory transistor having a first conducting terminal connected to said first bit line, a control terminal connected to said second conducting terminal of said second insulated gate field effect transistor, and a second conducting terminal,
   a second non-volatile memory transistor having a first conducting terminal connected to said second bit line, a control terminal connected to said second conducting terminal of said first insulated gate field effect transistor, and a second conducting terminal, and
   a third insulated gate field effect transistor having a first conducting terminal commonly connected to respective said second conducting terminals of said first and second non-volatile memory transistors, and a control terminal and a second conducting terminal commonly connected to a match line.

2. A content addressable memory cell including:

a first insulated gate field effect transistor having a first conducting terminal connected to a first bit line of a bit line pair, a control terminal connected to a word line, and a second conducting terminal, a second insulated gate field effect transistor having a first conducting terminal connected to a second bit line of said bit line pair, a control terminal connected to said word line, and a second conducting terminal, a first non-volatile memory transistor having a first conducting terminal connected to said second conducting terminal of said first insulated gate field effect transistor, a control terminal connected to said second conducting terminal of said second insulated gate field effect transistor, and a second conducting terminal, a second non-volatile memory transistor having a first conducting terminal connected to said second conducting terminal of said second insulated gate field effect transistor, a control terminal connected to said second conducting terminal of said first insulated gate field effect transistor, and a second conducting terminal, and a third insulated gate field effect transistor having a first conducting terminal commonly connected to respective said second conducting terminals of said first and second non-volatile memory transistors, and a control terminal and a second conducting terminal commonly connected to a match line.

3. A content addressable memory cell including:

a first insulated gate field effect transistor having a first conducting terminal connected to a first bit line of a bit line pair, a control terminal connected to a first word line of a word line pair, and a second conducting terminal, a second insulated gate field effect transistor having a first conducting terminal connected to said first word line, a control terminal connected to said first bit line, and a second conducting terminal, a third insulated gate field effect transistor having a first conducting terminal connected to a second bit line of said bit line pair, a control terminal connected to a second word line of said word line pair, and a second conducting terminal, a fourth insulated gate field effect transistor having a first conducting terminal connected to said second word line, a control terminal connected to said second bit line, and a second conducting terminal, a first non-volatile memory transistor having a first conducting terminal commonly connected to respective said second conducting terminals of said first and second insulated gate field effect transistors, a control terminal commonly connected to respective said second conducting terminals of said third and fourth insulated gate field effect transistors, and a second conducting terminal, a second non-volatile memory transistor having a first conducting terminal commonly connected to respective said second conducting terminals of said third and fourth insulated gate field effect transistors, a control terminal commonly connected to respective said second conducting terminals of said first and second insulated gate field effect transistors, and a second conducting terminal, a fifth insulated gate field effect transistor having a first conducting terminal commonly connected to respective said second conducting terminals of said first and second non-volatile memory transistors, and a control terminal and a second conducting terminal commonly connected to a first match line being parallel with said word line pair, and a sixth insulated gate field effect transistor having a first conducting terminal commonly connected to respective said second conducting terminals of said first and second non-volatile memory transistors, and a control terminal and a second conducting terminal commonly connected to a second match line being parallel with said bit line pair.

4. A content addressable memory cell comprising:

a first insulated gate field effect transistor having a first conducting terminal connected to a first bit line of a bit line pair, a second conducting terminal connected to a first data node, and a control terminal connected to a word line, a second insulated gate field effect transistor having a first conducting terminal connected to a second bit line of said bit line pair, a second conducting terminal connected to a second data node, and a control terminal connected to said word line, a first non-volatile memory transistor having a first conducting terminal connected to said first data node, a second conducting terminal connected to a power supply line, and a control terminal connected to a programming line, a second non-volatile memory transistor having a first conducting terminal connected to said second data node, a second conducting terminal connected to said power supply line, and a control terminal connected to said programming line, a third insulated gate field effect transistor having a first conducting terminal connected to said first data node, a second conducting terminal connected to an earthing wire, and a control terminal connected to said second data node, a fourth insulated gate field effect transistor having a first conducting terminal connected to said second data node, a second conducting terminal connected to said earthing wire, and a control terminal connected to said first data node, fifth and sixth insulated gate field effect transistors connected in series between a match line and a constant potential, said fifth insulated gate field effect transistor having a control terminal connected to said first bit line, said sixth insulated gate field effect transistor having a control terminal connected to said second data node, and seventh and eighth insulated gate field effect transistors connected in series between said match line and said constant potential, said seventh insulated gate field effect transistor having a control terminal connected to said second bit line, said eighth insulated gate field effect transistor having a control terminal connected to said first data node.

5. A content addressable memory cell comprising:

a first insulated gate field effect transistor having a first conducting terminal connected to a first bit line of a bit line pair, a second conducting terminal connected to a first data node, and a control terminal connected to a word line, a second insulated gate field effect transistor having a first conducting terminal connected to a second bit line of said bit line pair, a second conducting terminal connected to a second data node, and a control terminal connected to said word line, a first non-volatile memory transistor having a first conducting terminal connected to said first data node, a second conducting terminal connected to a power supply line, and a control terminal connected to a programming line, a second non-volatile memory transistor having a first conducting terminal connected to said second data node, a second conducting terminal connected to said power supply line, and a control terminal connected to said programming line, a third insulated gate field effect transistor having a first conducting terminal connected to said first data node, a second conducting terminal connected to an earthing wire, and a control terminal connected to said second data node, a fourth insulated gate field effect transistor having a first conducting terminal connected to said second data node, a second conducting terminal connected to said earthing wire, and a control terminal connected to said first data node, a fifth insulated gate field effect transistor having a first conducting terminal and a control terminal commonly connected to a match line, and a second conducting terminal, a sixth insulated gate field effect transistor having first and second conducting terminals, and a control terminal connected to said first data node, and a seventh insulated gate field effect transistor having first and second conducting terminals, and a control terminal connected to said second data node, respective said first conducting terminals of said sixth and seventh insulated gate field effect transistors being commonly connected to said second conducting terminal of said fifth insulated gate field effect transistor, respective said second conducting terminals of said sixth and seventh insulated gate field effect transistors being connected to different bit lines of said bit line pair.

6. A content addressable memory system comprising:

a plurality of cells for content reference arrayed in the form of a matrix along a row direction and a column direction, a plurality of word lines commonly connected to said cells for content reference arrayed in the same rows respectively, a plurality of match lines commonly connected to said cells for content reference arrayed in the same rows respectively, and a plurality of bit lines commonly connected to said cells for content reference arrayed in the same columns, each of said cells for content reference including:

gate means connected to corresponding said word line and corresponding said bit line for controlling transmission of information, a memory cell for storing/holding information supplied through said gate means, and comparison means comparing information stored in said memory cell with reference information supplied through corresponding said bit line for controlling connection/cutoff between a reference potential source and corresponding said match line, said content addressable memory system further comprising:

a plurality of match/mismatch detection means each provided for every said match line to detect match-/mismatch between storage information in each said memory cell belonging to corresponding said match line and said reference information, each said match/mismatch detection means including:

current-voltage conversion means for converting the value of a current flowing in said reference potential source through said match line into a voltage value, and voltage sensing means for level-comparing output voltage of said current-voltage conversion means with a prescribed threshold value.

7. A content addressable memory cell according to claim 1, wherein at least one of said first and second non-volatile transistors comprises a floating gate avalanche transistor.

8. A content addressable memory cell according to claim 1, wherein at least one of said first and second non-volatile transistors comprises a MNOS transistor.

9. A content addressable memory cell according to claim 1, wherein at least one of said first and second non-volatile transistors comprises a floating gate tunnel oxide (FLOTOX) transistor.

10. A content addressable memory cell according to claim 2, wherein at least one of said first and second non-volatile transistors comprises a floating gate avalanche transistor.

11. A content addressable memory cell according to claim 2, wherein at least one of said first and second non-volatile transistors comprises a MNOS transistor.

12. A content addressable memory cell according to claim 2, wherein at least one of said first and second non-volatile transistors comprises a floating gate tunnel oxide (FLOTOX) transistor.

13. A content addressable memory cell according to claim 3, wherein at least one of said first and second non-volatile transistors comprises a floating gate avalanche transistor.

14. A content addressable memory cell according to claim 3, wherein at least one of said first and second non-volatile transistors comprises a MNOS transistor.

15. A content addressable memory cell according to claim 3, wherein at least one of said first and second non-volatile transistors comprises a floating gate tunnel oxide (FLOTOX) transistor.

16. A content addressable memory cell according to claim 4, wherein at least one of said first and second non-volatile transistors comprises a floating gate avalanche transistor.

17. A content addressable memory cell according to claim 4, wherein at least one of said first and second non-volatile transistors comprises a MNOS transistor.

18. A content addressable memory cell according to claim 4, wherein at least one of said first and second non-volatile transistors comprises a floating gate tunnel oxide (FLOTOX) transistor.

19. A content addressable memory cell according to claim 5, wherein at least one of said first and second non-volatile transistors comprises a floating gate avalanche transistor.

20. A content addressable memory cell according to claim 5, wherein at least one of said first and second non-volatile transistors comprises a MNOS transistor.

21. A content addressable memory cell according to claim 5, wherein at least one of said first and second non-volatile transistors comprises a floating gate tunnel oxide (FLOTOX) transistor.

* * * * *